(12) United States Patent
Stura et al.

(10) Patent No.: US 12,702,167 B2
(45) Date of Patent: Aug. 11, 2026

(54) AEROSOL-GENERATING DEVICE WITH MEANS FOR IDENTIFYING A TYPE OF AN AEROSOL-GENERATING ARTICLE BEING USED WITH THE DEVICE

(71) Applicant: Philip Morris Products S.A., Neuchatel (CH)

(72) Inventors: Enrico Stura, Neuchatel (CH); Yannick Butin, Neuchatel (CH); Maxime Chateau, Neuchatel (CH)

(73) Assignee: Philip Morris Products S.A., Neuchatel (CH)

( * ) Notice: Subject to any disclaimer, the term of this patent is extended or adjusted under 35 U.S.C. 154(b) by 516 days.

(21) Appl. No.: 18/246,596

(22) PCT Filed: Sep. 29, 2021

(86) PCT No.: PCT/EP2021/076856
§ 371 (c)(1),
(2) Date: Mar. 24, 2023

(87) PCT Pub. No.: WO2022/069582
PCT Pub. Date: Apr. 7, 2022

(65) Prior Publication Data

US 2024/0008551 A1 Jan. 11, 2024

(30) Foreign Application Priority Data

Sep. 30, 2020 (EP) .................................... 20199174

(51) Int. Cl.
*A24F 40/53* (2020.01)
*A24D 1/20* (2020.01)
(Continued)

(52) U.S. Cl.
CPC ................ *A24F 40/53* (2020.01); *A24D 1/20* (2020.01); *A24F 40/20* (2020.01); *A24F 40/465* (2020.01);
(Continued)

(58) Field of Classification Search
None
See application file for complete search history.

(56) References Cited

U.S. PATENT DOCUMENTS

2017/0064996 A1 3/2017 Mironov
2018/0289067 A1 10/2018 Courbat et al.
(Continued)

FOREIGN PATENT DOCUMENTS

CN 108338420 A 7/2018
CN 110476477 A 11/2019
(Continued)

OTHER PUBLICATIONS

International Search Report & Written Opinion issued Jan. 5, 2022 in PCT/EP2021/076856, filed on Sep. 29, 2021, 15 pages.
(Continued)

*Primary Examiner* — Cynthia Szewczyk
(74) *Attorney, Agent, or Firm* — Oblon, McClelland, Maier & Neustadt, L.L.P.

(57) ABSTRACT

An aerosol-generating device is provided for alternative use with at least a first type and a second type of inductively heatable aerosol-generating articles including a susceptor arrangement, the device including: a receptacle to removably receive at least a portion of the first or the second type of article; an inductive heating arrangement to generate an alternating magnetic field for inductively heating the susceptor arrangement when the article is received by the receptacle; and a controller operatively connected to the heating arrangement and being configured to: determine a
(Continued)

first value and a second value of an electrical property of the susceptor arrangement being reached during heating of the susceptor arrangement in use of the device when the article is received by the receptacle, determine the difference between the first and the second values, and identify an article type of the article received by the receptacle based on the determined difference.

15 Claims, 5 Drawing Sheets

(51) Int. Cl.

| | |
|---|---|
| ***A24F 40/20*** | (2020.01) |
| ***A24F 40/465*** | (2020.01) |
| ***A24F 40/57*** | (2020.01) |
| ***G01R 15/14*** | (2006.01) |
| ***H05B 6/06*** | (2006.01) |
| ***H05B 6/10*** | (2006.01) |

(52) U.S. Cl.
CPC ............ *A24F 40/57* (2020.01); *G01R 15/146* (2013.01); *H05B 6/06* (2013.01); *H05B 6/105* (2013.01)

(56) References Cited

U.S. PATENT DOCUMENTS

| | | | |
|---|---|---|---|
| 2021/0186108 | A1 | 6/2021 | Korus et al. |
| 2021/0204587 | A1 | 7/2021 | Mironov |
| 2021/0267280 | A1 | 9/2021 | Zigmund |

FOREIGN PATENT DOCUMENTS

| | | | |
|---|---|---|---|
| JP | 2005-308663 | A | 11/2005 |
| JP | 2017-520234 | A | 7/2017 |
| KR | 10-2009-0071287 | A | 7/2009 |
| RU | 2 647 805 | C2 | 3/2018 |
| RU | 2 720 566 | C2 | 5/2020 |
| RU | 2 720 891 | C1 | 5/2020 |
| RU | 2 730 147 | C2 | 8/2020 |
| WO | WO 2015 176898 | A1 | 11/2015 |
| WO | WO 2015 177046 | A1 | 11/2015 |
| WO | WO 2015 177252 | A1 | 11/2015 |
| WO | WO 2015 177263 | A1 | 11/2015 |
| WO | WO 2015 177264 | A1 | 11/2015 |
| WO | WO 2015 177265 | A1 | 11/2015 |
| WO | WO 2017 036959 | A1 | 3/2017 |
| WO | WO 2017 068092 | A1 | 4/2017 |
| WO | WO 2020 020970 | A1 | 1/2020 |
| WO | WO 2020 043901 | A1 | 3/2020 |
| WO | WO 2020 064682 | A1 | 4/2020 |

OTHER PUBLICATIONS

Indonesian Office Action issued Sep. 1, 2025, in corresponding Indonesian Patent Application No. P00202303339, (with English Translation), 6 pages.
Israeli Office Action issued Sep. 8, 2025 in Israeli Patent Application No. 301660, 4 pages.
Vietnamese Office Action issued Aug. 25, 2025 in Vietnamese Patent Application No. 1-2023-02886, 2 pages.
Japanese Office Action issued Oct. 9, 2025 in Japanese Patent Application No. 2023-519891, 5 pages.
Combined Brazilian Office Action and Search Report issued Sep. 29, 2021 in Brazilian Patent Application No. BR112023005419-2 (with English Translation of Office Action only), 5 pages.
Philippian Office Action issued Jul. 9, 2025 in Philippian Patent Application No. 1/2023/550791, 6 pages.
Xu, Kai-Xian et al., "Series on Instrument Components" China Machine Press, Aug. 31, 1981, with machine generated English translation.
Sun, Jun et al. "Urban Environmental Geotechnical Engineering", Shanghai Scientific & Technical Publishers, Jun. 30, 2005, with machine generated English translation.
Office Action issued Jan. 14, 2026 in Chinese Patent Application No. 202180066214.7, with English translation.
Office Action issued Apr. 1, 2026, in Korean Patent Application No. 10-2023-7014631, with English translation.

62
MCU
60
50
+V_DC
63
10
13
14
L1
R
15
T
C2
L2
C1
18
12
11

G
235
233
237
235b
236
237b
T
T0
T1

AEROSOL-GENERATING DEVICE WITH MEANS FOR IDENTIFYING A TYPE OF AN AEROSOL-GENERATING ARTICLE BEING USED WITH THE DEVICE

The present disclosure relates to an aerosol-generating device with means for identifying a type of an aerosol-generating article being used with the device. The disclosure also relates to an aerosol-generating system comprising such a device as well as at least one type of an aerosol-generating article for use with the device. Furthermore, the disclosure relates to a method of identifying a type of an aerosol-generating article received by such a device.

Aerosol-generating devices for generating inhalable aerosols by electrically heating aerosol-forming substrates are generally known from prior art. Such devices may comprise a receptacle for removably receiving at least a portion of an aerosol-generating article that includes the aerosol-forming substrate to be heated. The devices further comprise an electrical heating arrangement for heating the substrate, when the article is received in the cavity. In particular, the heating arrangement may be an inductive heating arrangement configured to generate an alternating magnetic field for inductively heating a susceptor within the aerosol-generating article when the article is received by the receptacle of the device.

In general, such aerosol-generating devices may be configured either for use with a single type of an aerosol-generating article or for alternative use with two or more different types of aerosol-generating articles. In order to detect the type of the aerosol-generating article currently received by the receptacle, the article may comprise means for identifying a type of the aerosol-generating article being used with the device. Such kind of detection may be realized by separate sensor means within the device which are responsive to specific markers on the article side being indicative of the article type. However, having separate sensor means on the device side and specific markers on the article side is accompanied by a higher technical effort and increased production costs for both, the device and the article.

Therefore, it would be desirable to have an aerosol-generating device and a method allowing for identification of a type of an aerosol-generating article being used with the aerosol-generating device having the advantages of prior art solutions, whilst mitigating their limitations. In particular, it would be desirable to have an aerosol-generating device, an aerosol-generating system and a method allowing identification of the article type in a technically simple manner.

According to the present invention, there is provided an aerosol-generating device for use with an aerosol-generating article comprising a susceptor arrangement. The aerosol-generating device comprises a receptacle configured to removably receive at least a portion of the aerosol-generating article. The device further comprises an inductive heating arrangement configured to generate an alternating magnetic field for inductively heating the susceptor arrangement of the aerosol-generating article when the aerosol-generating article is received by the receptacle. In addition, the aerosol-generating device comprises a controller operatively connected to the inductive heating arrangement and configured to determine a first value and a second value, in particular an initial value and an extremal value, of an electrical property of the susceptor arrangement being reached during heating of the susceptor arrangement in use of the device when the aerosol-generating article is received by the receptacle. The controller is further configured to determine the difference between the first value and the second value, in particular between the initial value and the extremal value, and to identify an article type of the aerosol-generating article received by the receptacle based on the determined difference.

According to the invention, it has been found that for identifying the article type separate sensor means on the device side and specific markers on the article side can be omitted for inductively heating aerosol-generating systems by using already existing components of the system, that is, the controller in combination with the inductive heating arrangement and the susceptor arrangement. In particular, it has been found that if the susceptor arrangement of the aerosol-generating article comprises at least one electrical property which passes through characteristic values during heating, namely, from a first value to a second value, in particular from an initial value to an extremal value, the difference between the first value and the second value may be distinctive and thus indicative of the specific article type. On the device side, the first value and the second value of the electrical property can be easily detected by the controller in combination with the inductive heating arrangement. For example, if the first value and the second value of the electrical property are values indicative of the electrical conductance of the susceptor arrangement, these values may go along with a corresponding first and second value, in particular a corresponding initial and extremal value of the supply current drawn by the inductive heating arrangement in heating the susceptor arrangement. Accordingly, the controller may be easily configured to determine the corresponding first and second values of a signal that is indicative of the first and the second value of the supply current drawn by the inductive heating arrangement. In addition, the controller may be configured to determine the difference between the determined values and to identify an article type of the aerosol-generating article received by the receptacle based on the determined difference.

In general, the device may be configured for use with at least one type of aerosol-generating article. In particular, the device may be configured for use with a single type of aerosol-generating article.

The aerosol-generating article, in particular, the aerosol-generating article of the at least one type or the single type may comprise an aerosol-forming substrate capable to form an inhalable aerosol when heated and an inductively heatable susceptor arrangement for heating the substrate. A material composition of the susceptor arrangement of the aerosol-generating article, in particular of the at least one article type or the single article type, respectively, may be such that with increasing temperature a value of an electrical property of the susceptor arrangement changes, in particular decreases or increases, from a first value to a second value, in particular from an initial value to an extremal value. The susceptor arrangement of the aerosol-generating article, in particular of the at least one article type or the single article type, respectively, may have a distinctive difference between the first value and the second value, in particular between the initial value and the extremal value, wherein the difference is indicative of the article type.

Likewise, the device may be configured for use with at least two different types of aerosol-generating articles. For example, the aerosol-generating device may be configured for alternative use with an aerosol-generating article comprising a gel-like aerosol-forming substrate and an aerosol-generating article comprising a solid aerosol-forming substrate. The article of each type may comprise an aerosol-forming substrate capable to form an inhalable aerosol when heated and an inductively heatable susceptor arrangement for heating the substrate. The material composition of the susceptor arrangement of each article type may be such that with increasing temperature a value of an electrical property of the susceptor arrangement changes, in particular decreases or increases, from a first value to a second value, in particular from an initial value to an extremal value. The susceptor arrangement of each article type may have a distinctive difference between the respective first value and the respective second value, in particular the respective initial value and the respective extremal value, wherein the difference is indicative of the respective article type.

In other words, according to the invention there may be provided an aerosol-generating device for alternative use with at least a first type and a second type of inductively heatable aerosol-generating articles, wherein the article of each type comprises an aerosol-forming substrate capable to form an inhalable aerosol when heated and a susceptor arrangement for heating the substrate, wherein the device comprises

- a receptacle configured to removably receive at least a portion of the first type or the second type of aerosol-generating article,
- an inductive heating arrangement configured to generate an alternating magnetic field for inductively heating the susceptor arrangement of the first or second type of aerosol-generating article when the aerosol-generating article is received by the receptacle, and
- a controller operatively connected to the inductive heating arrangement and configured:
  - to determine a first value and a second value of an electrical property of the susceptor arrangement of the first type or the second type of article, the electrical property being reached during heating of the susceptor arrangement in use of the device when the aerosol-generating article of the first or the second type is received by the receptacle,
  - to determine the difference between the first value and the second value, and
  - to identify an article type of the aerosol-generating article received by the receptacle based on the determined difference.

For each article type, the first and the second value of the electrical property may be respectively an initial value and an extremal value, as will be described in more detail below. In particular, a material composition of the susceptor arrangement may be chosen such that with increasing temperature during heating-up an electrical property of the susceptor arrangement changes, in particular increases or decreases, from the initial value to the extremal value, and wherein the change of the electrical property from the initial value to the extremal value is indicative of a type of the aerosol-generating article. That is, the susceptor arrangement of each article type may have a distinctive difference between the respective first value and the respective second value, in particular the respective initial value and the respective extremal value, wherein the difference is indicative of the respective article type. Accordingly, the controller may be configured to determine the initial value and the extremal value of the electrical property of the susceptor arrangement being reached during heating-up in use of the device when an article of either type is received by the receptacle, to determine the difference between the determined initial value and the determined extremal value, and to identify the article type of the respective article received by the receptacle based on the determined difference.

In particular, the susceptor arrangements of the at least two different types of aerosol-generating articles may differ from each other in at least one of the respective first value and the respective second value, in particular the respective initial value and the respective extremal of the value of the electrical property. Thus, the susceptor arrangement of each article type has a distinctive difference between the respective first value and the respective second value which is different from the difference between the respective first value and the respective second value of all other article types. In particular, the susceptor arrangements of the at least two different article types may differ from each other in at least one of the respective first value and the respective second of the value of the electrical property due to at least one of different material compositions of the respective susceptor arrangements or different dimensions of the respective susceptor arrangements.

The first value and the second value of the electrical property are respective values of the electrical property occurring or being reached at different times during heating, that is, during a heating operation of the heating arrangement, in particular at different temperatures of the susceptor arrangement. As time progresses, the second value preferably is reached later than the first value during heating. In particular, the second value preferably may be reached or may occur at a higher temperature than the first value.

In general, the first value may be different from the second value. In particular, the electrical property may increase from the first value to the second value. Likewise, the electrical property may decrease from the first value to the second value.

As stated above, the first value may be an initial value of the electrical property, and the second value preferably may be an extremal value, in particular a local extremal value, of the electrical property. The extremal value may be a minimum value or a maximum value. In particular, the extremal value may be a local minimum value or a local maximum value. As used herein, the term "local extremal value" of the electrical property is to be understood in the sense of mathematical analytics. That is, the term "local extremal value" refers to either the largest or the smallest value of the electrical property as a function of temperature within a given temperature range, in particular sub-range of temperatures which the susceptor arrangement can be subjected to. In particular, the smallest value of the electrical property as a function of temperature within a given temperature range, in particular sub-range of temperatures which the susceptor arrangement can be subjected to, is a "local minimum value", whereas the largest value of the electrical property as a function of temperature within a given temperature range, in particular sub-range of temperatures which the susceptor arrangement can be subjected to, is a "local maximum value" of the electrical property. The extremal value may also be a global extremal value or absolute extremal value, in particular a global or absolute minimum value, or a global or absolute maximum value. As used herein, the term "global extremal value" or "absolute extremal value" of the electrical property is also to be understood in the sense of mathematical analytics. That is, the term "global extremal value" or "absolute extremal value" refers to either the largest or the smallest absolute value(s) of the electrical property (as a function of temperature) on the entire temperature domain. In particular, the smallest absolute value(s) of the electrical property (as a function of temperature) on the entire temperature domain may be a "global minimum value" or "absolute minimum value" of the electrical property, whereas the largest absolute value(s) of the electrical property (as a function of temperature) on the entire temperature domain is a "local maximum value" or "absolute maximum value" of the electrical property. In case of a minimum, the electrical property may decrease from the initial value to the minimum value. In a case of a maximum, the electrical property may increase from the initial value to the maximum value.

The first value, in particular the initial value may occur or may be reached during heating-up the susceptor arrangement and the aerosol-forming substrate, that is, during heating-up the susceptor arrangement and the aerosol-forming substrate from an initial temperature, such as ambient temperature, to an operating temperature. The operating temperature may be the temperature that is required to vaporize volatile substances from the aerosol-forming substrate. Likewise, the second value, in particular the extremal value, may occur or may be reached during heating-up the susceptor arrangement and the aerosol-forming substrate. In other words the change from the first value to the second value of the electrical property, in particular the change from the initial value to the extremal value of the electrical property may occur during heating-up the susceptor arrangement and the aerosol-forming substrate. In particular, the value of the electrical property of the susceptor arrangement may change, in particular decrease or increase, from the first value to the second value, in particular from the initial value to the extremal value with increasing temperature.

More particularly, the first value, in particular the initial value may occur or may be reached at a start of the heat-up of the susceptor arrangement, in particular at an initial temperature of the susceptor arrangement, such as ambient temperature. The second value, in particular the extremal value, may occur or may be reached at a temperature of the susceptor arrangement corresponding to a Curie temperature of a material of the susceptor arrangement. The susceptor arrangement may comprise one or more materials, in particular at least two different materials.

Accordingly, the controller of the aerosol-generating device preferably is configured to determine a first value and a second value, in particular an initial value and an extremal value, of an electrical property of the susceptor arrangement of the aerosol-generating article that is received by the receptacle during heating-up the susceptor arrangement and the aerosol-forming substrate in use of the device, in particular during a heat-up operation of the inductive heating arrangement. Likewise, the controller preferably is configured to determine the difference and to identify the article type based on the determined difference also during heating-up the susceptor arrangement and the aerosol-forming substrate in use of the device, in particular during a heat-up operation of the inductive heating arrangement.

Hence, according to the present invention, there may be provided an aerosol-generating device for use with an aerosol-generating article, wherein the article comprises an aerosol-forming substrate capable to form an inhalable aerosol when heated and a susceptor arrangement for heating the substrate, wherein a material composition of the susceptor arrangement is chosen such that with increasing temperature during heating-up an electrical property of the susceptor arrangement changes, in particular decreases or increases, from an initial value to a local extremal value, and wherein the susceptor arrangement has a distinctive difference between the initial value and the extremal value, wherein the difference is indicative of the respective article type (that is, the change of the electrical property from the initial value to the local extremal value is indicative of a type of the aerosol-generating article), the aerosol-generating device comprising:

- a receptacle configured to removably receive at least a portion of the aerosol-generating article,
- an inductive heating arrangement configured to generate an alternating magnetic field for inductively heating the susceptor arrangement of the aerosol-generating article when the aerosol-generating article is received by the receptacle, and
- a controller operatively connected to the inductive heating arrangement and configured
  - to determine the initial value and the local extremal value of the electrical property of the susceptor arrangement being reached during heating of the susceptor arrangement in use of the device when the aerosol-generating article is received by the receptacle,
  - to determine the difference between the initial value and the local extremal value, and
  - to identify the type of the aerosol-generating article received by the receptacle based on the determined difference.

As described, the first value and the second value of the electrical property, in particular the initial value and the extremal value of the electrical property, may be values indicative of the electrical conductance of the susceptor arrangement. Likewise, the first value and the second value, in particular the initial value and the extremal value, of the electrical property may be values indicative of the supply current drawn by the inductive heating arrangement in heating the susceptor arrangement. In one example, the supply voltage supplied to the inductive heating arrangement is constant in heating the susceptor arrangement. Here, the electrical conductance of the susceptor arrangement is directly proportional to the supply current drawn by the inductive heating arrangement in heating the susceptor arrangement. Thus, by determining a value indicative of the supply current drawn by the inductive heating arrangement in heating the susceptor arrangement, the controller may also determine a value indicative of the electrical conductance of the susceptor arrangement. The same holds for the electrical apparent resistance of the susceptor arrangement which is inversely proportional to the supply current drawn by the inductive heating arrangement in heating the susceptor arrangement. That is, it may be sufficient to determine respective first and second values indicative of the supply current drawn by the inductive heating arrangement.

The electrical power for the inductive heating arrangement may be provided by a power supply of the aerosol-generating device. Accordingly, the aerosol-generating device may comprise a power supply that is operatively connected to the inductive heating arrangement and the controller configured to provide a supply current. In particular, the power supply may be a DC power supply configured to provide a DC supply voltage and a DC supply current. Preferably, the power supply is a battery such as a lithium iron phosphate battery. As an alternative, the power supply may be another form of charge storage device such as a capacitor. The power supply may require recharging, that is, the power supply may be rechargeable. The power supply may have a capacity that allows for the storage of enough energy for one or more user experiences. For example, the power supply may have sufficient capacity to allow for the continuous generation of aerosol for a period of around six minutes or for a period that is a multiple of six minutes. In another example, the power supply may have sufficient capacity to allow for a predetermined number of puffs or discrete activations of the induction source.

Hence, in order to determine the supply current drawn by the inductive heating arrangement, the controller may be configured to determine the supply current drawn from the power supply, and to determine the difference between the first value of the electrical property and the second value of the electrical property of the susceptor arrangement from the change in the supply current drawn from the power supply over time.

In particular, where the voltage supplied by the power supply decrease over time, it might be required to determine both the supply current and the supply voltage drawn from the power supply. Therefore, the controller may be configured to determine the supply current and the supply voltage drawn from the power supply, and to determine the difference between the first value of the electrical property and the second value of the electrical property of the susceptor arrangement from the change in the supply current and the supply voltage drawn from the power supply over time. In particular, the controller may be configured to determine the difference between the first value of the electrical property and the second value of the electrical property of the susceptor arrangement from the change in the ratio of the supply current to the supply voltage drawn from the power supply over time. This applies in particular where the first value and the second value of the electrical property may be values indicative of the electrical conductance or the electrical apparent resistance of the susceptor arrangement. This is because the electrical conductance of the susceptor arrangement is directly proportional to the ratio of the supply current to the supply voltage drawn from the power supply, and the electrical apparent resistance of the susceptor arrangement is inversely proportional to the ratio of the supply current to the supply voltage drawn from the power supply.

The difference between the first value and the second value of the electrical property of the susceptor arrangement may depend on the actual power rating of the aerosol-generating device. Although being of the same type, the actual power rating may vary for different aerosol-generating devices due to manufacturing tolerances. Accordingly, the inductive heating arrangement of each device may have a slightly different power rating used to generate the alternating magnetic field. This variance in the maximum power available may cause the values of the electrical property determined for different articles of the same type to vary as well. A certain variance of the determined values in turn may interfere with proper article identification as will be described further below. This applies in particular when the article identification is performed during the heat-up of the aerosol-forming substrate, where the inductive heating arrangement typically is operated at the maximum power. This is because no power buffer is available at the maximum power which could be used to level the power of the inductive heating arrangement. In order to reduce the effect of the variance in the maximum power, the controller may be configured to normalize the determined difference between the first value and the second value of the electrical property using a power rating of the inductive heating arrangement that is used to generate the alternating magnetic field. In particular, the controller may be configured to normalize the determined difference between the first value and the second value of the electrical property according to the following equation:

$$\text{Delta\_Norm}=k*(\text{Power\_Norm}-\text{Power})+\text{Delta}$$

wherein Delta_Norm is the normalized difference between the first value and the second value of the electrical property, Delta is the determined difference between the first value and the second value of the electrical property, Power_Norm is a power rating coefficient, k is a normalization coefficient empirically determined for a plurality of aerosol-generating devices, and Power is the power rating of the inductive heating arrangement at hand. Like the normalization coefficient, k, the power rating coefficient, Power_Norm, may be determined from an average power rating of a plurality of aerosol-generating devices. The power rating of the inductive heating arrangement may be determined and coded into the controller during manufacturing of the device by using a calibration article including a calibration susceptor arrangement. Likewise, the power rating coefficient Power_Norm and the normalization coefficient k may be coded into the controller during manufacturing of the device.

This kind of normalization advantageously enhances the identification accuracy, in particular in case where the device is configured for use with at least two different types of aerosol-generating articles. This is because the power normalization causes the distribution of differences between the first value and the second value determined for a plurality of articles of the same type to have a reduced standard deviation as without power normalization. As a consequence, the respective distributions of differences determined for articles of different types can be better distinguished from each other, and thus it is less likely that an article of one type is erroneously identified as an article of another type. Otherwise, misidentification may occur, in particular where the value of the difference between the first value and the second value indicative of one article type is close to the value of the difference between the first value and the second value indicative of another article type.

For identifying the article type the controller may be configured to compare the determined difference between the first value and the second value of the electrical property of the susceptor arrangement to one or more reference values or reference ranges of the difference stored in the device, wherein each reference value or reference range is indicative of a specific article type. A reference range may be a range with a minimum end-point and a maximum end point, or an open range with either a minimum end-point or a maximum end-point. In the latter two cases, the minimum end-point and the maximum end-point of an open range may be an upper threshold or a lower threshold of the difference which—when breached by the determined difference—is indicative of a specific article type.

The controller may be configured to control a heating operation of the inductive heating arrangement in response to the identified article type. In particular, the controller may be configured to a control heating operation of the inductive heating arrangement according to a respective one of one or more of predetermined heating profiles, each of which is associated to a specific article type. For example, a heating profile associated to an aerosol-generating article comprising a solid aerosol-forming substrate may have an operation temperature being lower than an operation temperature of a heating profile associated to an aerosol-generating article comprising a gel-like aerosol-forming substrate.

For this, it may be advantageous that the controller of the aerosol-generating device is configured to determine the first value and the second value of an electrical property of the susceptor arrangement during a heat-up of the aerosol-forming substrate in use of the device, in particular during a heat-up operation of the inductive heating arrangement.

Furthermore, the controller may be configured to determine the difference between the first value and the second value, and to identify the article type preferably also during the heat-up of the aerosol-forming substrate, such as during a heat-up operation of the inductive heating arrangement. Due to this, the controller is able to identify the article type in a timely manner enabling to control a subsequent heating operation of the inductive heating arrangement in response to the identified article type, in particular to select a predetermined heating profile on time before the start of the actual aerosol generation.

Where the device is configured for use with a single article type, the controller may be configured to allow heating of the substrate in the article only, if the controller identifies the type of the article currently received by the receptacle to correspond to that single article type. Otherwise, the controller may be configured to identify the type of the article currently received by the receptacle as being unsuitable or incompatible for use with the device. In the latter case, the controller may be configured to stop or disable operation of the heating arrangement, in particular to stop or disable heating of the substrate in the article. This may not only apply for those devices which are configured for use with a single type of an aerosol-generating article, but also for devices which are configured for use with at least one type of aerosol-generating article or at least two different types of aerosol-generating articles.

Therefore, irrespective of the designated use of the device, the controller may be configured to identify the type of the article currently received by the receptacle as being unsuitable or incompatible for use with the device, in particular when the determined difference does not correspond to any reference value or reference range of the difference. In addition, the controller may be configured to stop or disable operation of the heating arrangement in case the type of the article currently received by the receptacle is identified as being unsuitable or incompatible for use with the device.

In addition, the controller may be configured to identify an abnormal deviation of at least one of the first value or the second value of the electrical property. An abnormal deviation may occur, in particular if one of the device or the article is affected during the critical time window between the determination of the first value and the determination of the second value, such as during a heat-up operation of the inductive heating arrangement. For example, if a user displaces the aerosol-generating article relative to the aerosol-generating device during the critical time window by pushing the article further into the receptacle (for example, because the article was not fully received by the receptacle), the determined difference between the first value and the second value of the electrical property may be increased or decreased as each push may provoke an abrupt drop or rise of the electrical property. Vice versa, if the article is partially removed from the receptacle by pulling, the determined difference between the first value and the second value of the electrical property may be decreased or increased as each pull may provoke an abrupt rise or drop of the electrical property.

In a case where the controller is configured to identify an abnormal deviation, the controller may be further configured to control heating operation of the inductive heating arrangement according to a safety heating profile in response to the identification of an abnormal deviation of at least one of the first value or the second value of the electrical property. The safety heating profile may correspond to that heating profile out of a plurality of stored heating profiles which has the lowest operation temperature. Otherwise, overheating of the aerosol-forming substrate may occur in case an aerosol-generating article is misidentified as an article the associated heating profile of which has an operating temperature higher than the rated operating temperature of the article actually received by the receptacle. For example, the aerosol-generating device may be configured for use with an aerosol-generating article comprising a gel-like aerosol-forming substrate as well as for use with an aerosol-generating article comprising a solid aerosol-forming substrate. The operating temperature of the heating profile associated to the aerosol-generating article comprising the gel-like aerosol-forming substrate may be, for example, higher than the operating temperature of the heating profile associated to the aerosol-generating article comprising the solid aerosol-forming substrate. In this example, in response to the identification of an abnormal deviation of at least one of the first value or the second value of the electrical property, the controller may control heating operation of the inductive heating arrangement according to a heating profile associated to an aerosol-generating article comprising a solid aerosol-forming substrate.

Alternatively or in addition, the controller may be configured to stop and subsequently restart the process of determining the first value and the second value, determining the difference between the first value and the second value and identifying the article type.

The controller may be configured to verify identification of the article type, in particular to verify the first value and the second value determined in a first measurement, or else to identify an abnormal deviation of at least one of the first value or the second value of the electrical property determined in a first measurement, by repeating the process of determining the first value and the second value in a second measurement and comparing at least one of the first value determined in the first measurement with the first value determined in the second measurement, and the second value determined in the first measurement with the second value determined in the second measurement. For both, the first measurement and the second measurement, the heating arrangement may be configured to heat up the susceptor arrangement until the electrical property of the susceptor arrangement reaches or passes an extremal value, in particular a local extremal value, at which the second values is determined. Between the first measurement and the second measurement, the susceptor arrangement may be allowed to cool down until the electrical property is again below or above the second value, in particular the extremal value, depending on whether the second value, in particular the extremal value is a maximum value or a minimum value. For this, the heating arrangement may be configured to stop heating between the first measurement and the second measurement or to reduce the heating power between the first measurement and the second measurement or to reduce a duty cycle of the heating process between the first measurement and the second measurement.

Moreover, the controller may be configured to determine for the first measurement and the second measurement a time required by the electrical property of the susceptor arrangement to reach the respective extremal value at which the respective second value is determined, that is, a time interval between the determination of the first value and the determination of the second value.

In particular, the controller may be configured to identify an abnormal deviation by comparing the second value determined in the first measurement with the second value determined in the second measurement, and by determining that the second value determined in the first measurement deviates from the second value determined in the second measurement by a certain amount, for example, by more than 5 percent or more than 10 percent or more than 20 percent. If so, it is likely that the article was partially removed from the receptacle by pulling during the first measurement, thus providing an abrupt rise or drop of the electrical property, that is, an artifactual extremal value, which was erroneously identified as an extremal value by the controller causing the second value being taken at a wrong, in particular too low temperature during the first measurement. Vice versa, the controller may be configured to verify identification of the article type by comparing the second value determined in the first measurement with the second value determined in the second measurement, and by determining that the second value determined in the first measurement deviates from the second value determined in the second measurement by at least 5 percent or at least 10 percent.

In addition or alternatively, the controller may be configured to identify an abnormal deviation by comparing the time required by the electrical property of the susceptor arrangement to reach the respective extremal value for the first measurement with the time required by the electrical property of the susceptor arrangement to reach the respective extremal value during the second measurement, and by determining that the time required during the first measurement is shorter than, in particular less than 90 percent or less than 75 percent of the time required during the second measurement. If so, it also is likely that the article was partially removed from the receptacle by pulling during the first measurement, thus causing an artifactual extremal value at a lower temperature as described above. As a consequence, the time for the first measurement would be shorter than expected to reach the actual extremal value at the correct (higher) temperature. In other words, the controller may be configured to verify identification of the article type by comparing the time required by the electrical property of the susceptor arrangement to reach the respective extremal value for the first measurement with the time required by the electrical property of the susceptor arrangement to reach the respective extremal value during the second measurement, and by determining that the time required during the first measurement deviates from the time required during the second measurement by at least 5 percent or at least 10 percent.

Both criteria, that is, "second value determined in the first measurement deviates from the second value determined in the second measurement by at least 5 percent or at least 10 percent" and "time required during the first measurement deviates from the time required during the second measurement by at least 5 percent or at least 10 percent" may be applied alternatively or in combination. That is, the controller may be configured to verify identification of the article type if one or at least one of the two criteria is met, or if only both criteria are met. A misidentification may also occur, if the susceptor arrangement is at an increased temperature level when the article type is to be identified by the controller, in particular at the start of a user experience. This may occur, for example, when a user aborts a user experience by stopping operation of the heating arrangement and only shortly after that restarts a new user experience with the same article. Likewise, such a situation may occur, when the article has already been heated by another device or by an oven before being received in the device. As a result, the first value of the electrical property determined at an increased temperature level, for example, after a "hot" restart may be different than it would be, if it was determined at a lower temperature level, for example, at an ambient temperature level of the device. In order to avoid a misidentification under such circumstances, the controller may be configured to disable starting an operation of the inductive heating arrangement for a predetermined pause time after a previous operation of the inductive heating arrangement. The predetermined pause time may be in a range between 0.5 seconds to 120 seconds, in particular between 1 second and 60 seconds, preferably between 5 seconds and 30 seconds. A pause time in these ranges may allow a sufficient cool down of the susceptor arrangement.

The device may comprise a user interface configured to indicate the identified article type. For this, the user interface may comprise, for example, a display or one or more light sources, such as one or more LEDs (Light Emitting Diodes).

Furthermore, the device may comprise a cavity for removably receiving at least a portion of an aerosol-generating article of the at least one article type or the at least two article types or the single article type, respectively. In particular, the cavity may realize at least a part of the receptacle of the device. Or vice versa, the cavity may be realized at least partially by the receptacle of the device. The cavity may comprise an insertion opening through which a respective aerosol-generating article may be inserted into the cavity. As used herein, the direction in which an aerosol-generating article is inserted is denoted as insertion direction. Preferably, the insertion direction corresponds to the extension of a length axis, in particular a center axis of the cavity.

Upon insertion into the cavity, at least a portion of the aerosol-generating article may still extend outwards through the insertion opening. The outwardly extending portion of the aerosol-generating article preferably is provided for interaction with a user, in particular for being taken into a user's mouth. Hence, during use of the device, the insertion opening may be close to the mouth. Accordingly, as used herein, sections close to the insertion opening or close to a user's mouth in use of the device, respectively, are denoted with the prefix "proximal". Sections which are arranged further away are denoted with the prefix "distal".

The cavity may have any suitable cross-section as seen in a plane perpendicular to a length axis of the cavity or perpendicular to an insertion direction of the article. In particular, the cross-section of the cavity may correspond to the shape of the respective aerosol-generating article(s) to be received therein. Preferably, the cavity has a substantially circular cross-section. Alternatively, the cavity may have a substantially elliptical cross-section or a substantially oval cross-section or a substantially square cross-section or a substantially rectangular cross-section or a substantially triangular cross-section or a substantially polygonal cross-section.

The inductive heating arrangement may comprise an induction source including an induction coil for generating a varying, in particular an alternating magnetic field. The varying magnetic field preferably is generated at the place of the aerosol-forming substrate in use of the device, in particular within a cavity as described above. The varying magnetic field may be high-frequency varying magnetic field. The varying magnetic field may be in the range between 500 kHz (kilo-Hertz) to 30 MHz (Mega-Hertz), in particular between 5 MHz to 15 MHz, preferably between 5 MHz and 10 MHz. The varying magnetic field is used to inductively heat the susceptor arrangement of the aerosol-generating article due to at least one of Eddy currents or hysteresis losses, depending on the electrical and magnetic properties of the susceptor material(s).

The at least one induction coil may be a helical coil or flat planar coil, in particular a pancake coil or a curved planar coil. The at least one induction coil may be held within one of a main body or a housing of the aerosol-generating device. The induction coil may be arranged such as to surround at least a portion of the receptacle. In particular, the induction coil may be arranged such as to surround at least a portion of a cavity of the device or at least a portion of the inner surface of such a cavity, respectively. For example, the induction coil may be an induction coil a helical coil, arranged within a side wall of the cavity.

The induction source may comprise an alternating current (AC) generator. The AC generator may be powered by the power supply of the aerosol-generating device. The AC generator is operatively coupled to the at least one induction coil. In particular, the at least one induction coil may be integral part of the AC generator. The AC generator is configured to generate a high frequency oscillating current to be passed through the at least one induction coil for generating an alternating magnetic field. The AC current may be supplied to the at least one induction coil continuously following activation of the system or may be supplied intermittently, such as on a puff by puff basis.

Preferably, the induction source comprises a DC/AC converter connected to the DC power supply including an LC network, wherein the LC network comprises a series connection of a capacitor and the inductor. In addition, the induction source may comprise a matching network for impedance matching. In particular, the induction source comprise may comprise a power amplifier, for example a Class-C power amplifier or a Class-D power amplifier or Class-E power amplifier.

The aerosol-generating device may further comprise a flux concentrator arranged around at least a portion of the induction coil and configured to distort the alternating magnetic field of the at least one inductive source towards the receptacle, for example, towards a cavity. Thus, when the article is received by the receptacle, the alternating magnetic field is distorted towards the susceptor arrangement of the article. Preferably, the flux concentrator comprises a flux concentrator foil, in particular a multi-layer flux concentrator foil.

The aerosol-generating device may comprise a main body which preferably includes at least one of the heating arrangement, the controller, the power supply and at least a portion of the cavity, as far as present. In addition to the main body, the aerosol-generating device may further comprise a mouthpiece, in particular in case the aerosol-generating article to be used with the device does not comprise a mouthpiece. The mouthpiece may be mounted to the main body of the device. As used herein, the term “mouthpiece” refers to a portion of the article through which the aerosol exits the device. The mouthpiece may be configured to close the receiving cavity upon mounting the mouthpiece to the main body. In case the device does not comprise a mouthpiece, an aerosol-generating article to be used with the aerosol-generating device may comprise a mouthpiece, for example a filter plug.

The aerosol-generating device may comprise at least one air outlet, for example, an air outlet in the mouthpiece (if present).

Preferably, the aerosol-generating device comprises an air path extending from the at least one air inlet through the cavity, and possibly further to an air outlet in the mouthpiece, if present. Preferably, the aerosol-generating device comprises at least one air inlet in fluid communication with the cavity. Preferably, the aerosol-generating device in combination with the aerosol-generating article received by the device may comprise an air path extending from the at least one air inlet into the cavity, and possibly further through the aerosol-forming substrate within the article and a mouthpiece into a user’s mouth.

Preferably, the aerosol-generating device is a puffing device for generating an aerosol that is directly inhalable by a user through the user’s mouth. In particular, the aerosol-generating device may be a hand-held aerosol-generating device.

According to the present invention, there is also provided an aerosol-generating system comprising an aerosol-generating device according to the present invention and as described herein. The system further comprises at least one type of aerosol-generating article or at least two aerosol-generating articles of different types which the device is configured to be used with, in particular to be exclusively used with. The article of each type, that is, the at least one type or the at least two different types, comprises an aerosol-forming substrate capable to form an inhalable aerosol when heated and an inductively heatable susceptor arrangement for heating the substrate.

As described above with regard to the aerosol-generating device, a material composition of the susceptor arrangement of each article type may be such that with increasing temperature an electrical property of the susceptor arrangement changes, in particular decreases or increases, from a first value to a second value, in particular from an initial value to an extremal value, and wherein the susceptor arrangement of each article type has a distinctive difference between the respective first value and the respective second value, the difference being indicative of the article type.

As further described above with regard to the aerosol-generating device, the susceptor arrangements of the different article types may differ in at least one of a dimension of the respective susceptor arrangement or the material composition of the respective susceptor arrangement.

According to the present invention, there is also provided an aerosol-generating system comprising an aerosol-generating device according to the present invention and as described herein and at least one aerosol-generating article of a specific type, the device is configured to be used with, in particular to be exclusively used with.

The article of the specific type may comprise an aerosol-forming substrate capable to form an inhalable aerosol when heated and an inductively heatable susceptor arrangement for heating the substrate. A material composition of the susceptor arrangement may be chosen such that with increasing temperature an electrical property of the susceptor arrangement changes, in particular decreases or increases from a first value to a second value, in particular from an initial value to an extremal value, and wherein the susceptor arrangement has a distinctive difference between the first value and the second value, the difference being indicative of the specific article type.

With respect to both systems, the susceptor arrangement may be positioned in thermal proximity to or thermal contact with the aerosol-forming substrate such that in use the substrate is heated by the susceptor arrangement when the article is received by the receptacle of the device.

As used herein, the term “susceptor arrangement” refers to an element comprising one or more materials capable of being inductively heated within an alternating magnetic field. This may be the result of at least one of hysteresis losses or Eddy currents induced in the susceptor arrangement, depending on the electrical and magnetic properties of the respective susceptor material.

As used herein, the term "aerosol-forming substrate" denotes a substrate formed from or comprising an aerosol-forming material that is capable of releasing volatile compounds upon heating for generating an aerosol. The aerosol-forming substrate is intended to be heated rather than combusted in order to release the aerosol-forming volatile compounds. The aerosol-forming substrate may be a solid aerosol-forming substrate, a liquid aerosol-forming substrate, a gel-like aerosol-forming substrate, or any combination thereof. The aerosol-forming substrate may comprise a tobacco-containing material containing volatile tobacco flavor compounds, which are released from the substrate upon heating. Alternatively or additionally, the aerosol-forming substrate may comprise a non-tobacco material. The aerosol-forming substrate may further comprise an aerosol former. Examples of suitable aerosol formers are glycerin and propylene glycol. The aerosol-forming substrate may also comprise other additives and ingredients, such as nicotine or flavourants. The aerosol-forming substrate may also be a paste-like material, a sachet of porous material comprising aerosol-forming substrate, or, for example, loose tobacco mixed with a gelling agent or sticky agent, which could include a common aerosol former such as glycerin, and which is compressed or molded into a plug.

As used herein, the term "aerosol-generating article" refers to an article comprising at least one aerosol-forming substrate that, when heated, releases volatile compounds that can form an aerosol. Preferably, the aerosol-generating article is a heated aerosol-generating article. That is, an aerosol-generating article which comprises at least one aerosol-forming substrate that is intended to be heated rather than combusted in order to release volatile compounds that can form an aerosol. The aerosol-generating article may be a consumable, in particular a consumable to be discarded after a single use. The article may be a cartridge including a liquid aerosol-forming substrate to be heated. Likewise, the article may be a rod-shaped article, in particular a tobacco article, resembling conventional cigarettes.

As an example, the aerosol-generating article of each type, that is, the article of the single type or the article of the at least one type or the articles of the at least two different types, may comprise one or more of the following elements: a first support element, a substrate element, a second support element, a cooling element, and a filter element. Preferably, the aerosol-generating article comprises at least a first support element, a second support element and a substrate element located between the first support element and the second support element.

The substrate element preferably comprise the at least one aerosol-forming substrate to be heated and the susceptor arrangement in thermal contact with or thermal proximity to the aerosol-forming substrate.

At least one of the first support element and the second support element may comprise a central air passage. Preferably, at least one of the first support element and the second support element may comprise a hollow cellulose acetate tube. Alternatively, the first support element may be used to cover and protect the distal front end of the substrate element.

The aerosol-cooling element is an element having a large surface area and a low resistance to draw, for example 15 mmWG to 20 mmWG. In use, an aerosol formed by volatile compounds released from the substrate element is drawn through the aerosol-cooling element before being transported to the proximal end of the aerosol-generating article.

The filter element preferably serves as a mouthpiece, or as part of a mouthpiece together with the aerosol-cooling element. As used herein, the term "mouthpiece" refers to a portion of the article through which the aerosol exits the aerosol-generating article.

All of the aforementioned elements may be sequentially arranged along a length axis of the article in the above described order, wherein the first support element preferably is arranged at a distal end of the article and the filter element preferably is arranged at a proximal end of the article. Each of the aforementioned elements may be substantially cylindrical. In particular, all elements may have the same outer cross-sectional shape. In addition, the elements may be circumscribed by an outer wrapper such as to keep the elements together and to maintain the desired cross-sectional shape of the rod-shaped article. Preferably, the wrapper is made of paper. The wrapper may further comprise adhesive that adheres the overlapped free ends of the wrapper to each other.

Further features and advantages of the aerosol-generating systems according to the invention have been described with regard to the aerosol-generating device and equally apply.

According to the present invention, there is provided a method of identifying a type of an aerosol-generating article received by an inductively heating aerosol-generating device, in particular an aerosol-generating device according to the invention and as described herein. The article comprises an aerosol-forming substrate capable to form an inhalable aerosol when heated and a susceptor arrangement inductively heatable by an inductive heating arrangement of the device for heating the substrate. A material composition of the susceptor arrangement is such that with increasing temperature a value of an electrical property of the susceptor arrangement changes, in particular decreases or increases, from a first value to a second value, in particular from an initial value to an extremal value, and wherein the susceptor arrangement of the article type has a distinctive difference between the first value and the second value, the difference being indicative of the article type. The method comprises:

- heating-up the aerosol-forming substrate of the aerosol-generating article received by the inductively heating aerosol-generating device using the device,
- determining during heating the first value and the second value of electrical property of the susceptor arrangement,
- determining the difference between the first value and the second value of electrical property, and
- identifying the article type of the aerosol-generating article based on the determined difference.

As already described above with regard to the aerosol-generating device according to the present invention, the first value may be an initial value of the electrical property, and the second value may be an extremal value of the electrical property. The extremal value may be a minimum value or a maximum value. In case of a minimum, the electrical property may decrease from the initial value to the minimum value. In a case of a maximum, the electrical property may increase from the initial value to the maximum value. The first value, in particular the initial value, may occur or may be reached during heating-up the susceptor arrangement and the aerosol-forming substrate, that is, during heating-up the susceptor arrangement and the aerosol-forming substrate from an initial temperature, such as ambient temperature, to an operating temperature. The operating temperature may be the temperature that is required to vaporize volatile substances from the aerosol-forming substrate. Likewise, the second value, in particular the extremal value may occur or may be reached during heating-up the susceptor arrangement and the aerosol-forming substrate. In other words, the change from first value to the second value of the electrical property, in particular the change from the initial value to the extremal value of the electrical property, may occur during heating-up the susceptor arrangement and the aerosol-forming substrate.

More particularly, the first value, in particular the initial value may occur or may be reached at a start of the heat-up of the susceptor arrangement, in particular at an initial temperature of the susceptor arrangement, such as ambient temperature. The second value, in particular the extremal value, may occur or may be reached at a temperature of the susceptor arrangement corresponding to a Curie temperature of a material of the susceptor arrangement. The susceptor arrangement may comprise one or more materials, in particular at least two different materials.

As already described above with regard to aerosol-generating device according to the present invention, the method may comprise normalizing the determined difference between the first value and the second value of the electrical property using a power rating of the inductive heating arrangement used to generate the alternating magnetic field. Advantageously, normalization may facilitate to compensate for effects due to a variance in the power rating.

In particular, the determined difference between the first value and the second value of the electrical property may be normalized according to the following equation:

$$\text{Delta\_Norm} = k * (\text{PowerNorm} - \text{Power}) + \text{Delta},$$

wherein Delta_Norm is the normalized difference, Delta is the determined difference, Power_Norm is a power rating coefficient, k is a normalization coefficient empirically determined for a plurality of aerosol-generating devices, and Power is the power rating of the inductive heating arrangement. The power rating coefficient, Power_Norm, may be determined from an average power rating of aerosol-generating devices.

As further described above with regard to aerosol-generating device according to the present invention, identifying the article type may comprise comparing the determined difference between the first value and the second value of the electrical property to one or more stored reference values of the difference, each reference value or reference range being indicative of a specific article type.

Further, the method may comprise controlling a heating operation of the inductive heating arrangement in response to the identified article type. In particular, heating operation of the inductive heating arrangement (in particular after heating-up) may be controlled according to a respective one of one or more predetermined heating profiles, each of which is associated to a specific article type.

The method may further comprise identifying an abnormal deviation of at least one of the first value or the second value of the electrical property. Doing so, the heating operation of the inductive heating arrangement (in particular after heating-up) may be controlled according to a safety heating profile in response to identifying an abnormal deviation of at least one of the first value or the second value of the electrical property.

The method may further comprise indicating the identified article type to a user. Advantageously, this enhances the usability.

As further described above with regard to aerosol-generating device according to the present invention, the method may comprise disabling starting an operation of the inductive heating arrangement for a predetermined pause time after a previous operation of the inductive heating arrangement. This may help to avoid misidentification if a user aborts a user experience and only shortly after wants to restart a new user experience with the same article. The predetermined pause time may be in a range between 0.5 seconds to 120 seconds, in particular between 1 second and 60 seconds, preferably between 5 seconds and 30 seconds.

The first value and the second value of the electrical property may be values indicative of the conductance of the susceptor arrangement. In particular, the first value and the second value of the electrical property may be values indicative of a supply current drawn by the inductive heating arrangement in heating the susceptor arrangement.

Where the device comprises a power supply configured to provide a supply current and operatively connected to the inductive heating arrangement and the controller, the method may comprise determining a supply current drawn from the power supply of the aerosol-generating device. In doing so, the difference between the first value of the electrical property and the second value of the electrical property of the susceptor arrangement may be determined from the change in the supply current drawn from the power supply over time. Likewise, the method may comprise determining a supply current and a supply voltage drawn from a power supply of the aerosol-generating device, and further determining the difference between the first value of the electrical property and the second value of the electrical property of the susceptor arrangement from the change in the supply current and the supply voltage drawn from the power supply over time, in particular from the change in the ratio of the supply current to the supply voltage drawn from the power supply over time.

The method may further comprise identifying the type of the article currently received by the aerosol-generating device as being unsuitable or incompatible for use with the device, in particular when the determined difference does not correspond to any reference value or reference range of the difference. In addition, the method may comprise stopping or disabling an operation of the heating arrangement in case the type of the article currently received by the device is identified as being unsuitable or incompatible for use with the device.

Further features and advantages of the method according to the invention have been described with regard to the aerosol-generating device and the aerosol-generating systems and equally apply.

The invention is defined in the claims. However, below there is provided a non-exhaustive list of non-limiting examples. Any one or more of the features of these examples may be combined with any one or more features of another example, embodiment, or aspect described herein.

Example Ex1: An aerosol-generating device for use with an aerosol-generating article comprising a susceptor arrangement, the aerosol-generating device comprising:

- a receptacle configured to removably receive at least a portion of the aerosol-generating article,
- an inductive heating arrangement configured to generate an alternating magnetic field for inductively heating the susceptor arrangement of the aerosol-generating article when the aerosol-generating article is received by the receptacle, and
- a controller operatively connected to the inductive heating arrangement and configured
  - to determine a first value and a second value of an electrical property of the susceptor arrangement being reached during heating of the susceptor arrangement in use of the device when of the aerosol-generating article that is received by the receptacle, to determine the difference between the first value and the second value, and to identify an article type of the aerosol-generating article received by the receptacle based on the determined difference.

Example Ex1a: The aerosol-generating device according to example Ex1, wherein a material composition of the susceptor arrangement such that with increasing temperature a value of an electrical property of the susceptor arrangement changes, in particular decreases or increases, from a first value to a second value, in particular from an initial value to an extremal value, and wherein the susceptor arrangement has a distinctive difference between the first value and the second value, the difference being indicative of the article type.

Example Ex2: The aerosol-generating device according to example Ex1, wherein the device is configured for use with at least one type of aerosol-generating article, wherein the aerosol-generating article comprises an aerosol-forming substrate capable to form an inhalable aerosol when heated and an inductively heatable susceptor arrangement for heating the substrate.

Example Ex2a: The aerosol-generating device according to example Ex2a, wherein a material composition of the susceptor arrangement of the at least one article type is such that with increasing temperature a value of an electrical property of the susceptor arrangement changes, in particular decreases or increases, from a first value to a second value, in particular from an initial value to an extremal value, and wherein the susceptor arrangement of the at least one article type has a distinctive difference between the first value and the second value, the difference being indicative of the article type.

Example Ex3: The aerosol-generating device according to example Ex1, wherein the device is configured for use with a single type of aerosol-generating article, wherein the aerosol-generating article comprises an aerosol-forming substrate capable to form an inhalable aerosol when heated and an inductively heatable susceptor arrangement for heating the substrate.

Example Ex3a: The aerosol-generating device according to example Ex3, wherein a material composition of the susceptor arrangement of the single article type is such that with increasing temperature a value of an electrical property of the susceptor arrangement changes from a first value to a second value, in particular decreases or increase from a first value to a second value, in particular from an initial value to an extremal value, and wherein the susceptor arrangement of the single article type has a distinctive difference between the first value and the second value, the difference being indicative of the single article type Example Ex4: The aerosol-generating device according to example Ex3 or example Ex3a, wherein the controller is configured to enable heating of the substrate in the article, only if the controller identifies that the type of the article currently received by the receptacle corresponds to the single article type.

Example Ex5: The aerosol-generating device according to example Ex1, wherein the device is configured for use with at least two different types of aerosol-generating articles, in particular for alternative use with at least a first type and a second type of inductively heatable aerosol-generating articles, wherein the article of each type comprises an aerosol-forming substrate capable to form an inhalable aerosol when heated and an inductively heatable susceptor arrangement for heating the substrate.

Example Ex5a: The aerosol-generating device according to example Ex5, wherein a material composition of the susceptor arrangement of each article type is such that with increasing temperature a value of an electrical property of the susceptor arrangement changes, in particular decreases or increases, from a first value to a second value, in particular from an initial value to an extremal value, and wherein the susceptor arrangement of each article type has a distinctive difference between the respective first value and the respective second value, the difference being indicative of the article type, the aerosol-generating device.

Example Ex6: The aerosol-generating device according to any one of the preceding examples, wherein the first value is an initial value of the electrical property and the second value is an extremal value, in particular minimum value or a maximum value, of the electrical property.

Example Ex6a: The aerosol-generating device according to any one of the preceding examples, wherein the first value, in particular the initial value, occurs or is reached during heating-up the susceptor arrangement, in particular from an initial temperature, such as ambient temperature, to an operating temperature.

Example Ex6b: The aerosol-generating device according to example Ex6a, wherein the second value, in particular the extremal value occurs or is reached during heating-up the susceptor arrangement, in particular from an initial temperature, such as ambient temperature, to an operating temperature.

Example Ex6c: The aerosol-generating device according to any one of the preceding examples, wherein the first value, in particular the initial value occurs or is reached at a start of the heat-up of the susceptor arrangement, in particular at an initial temperature of the susceptor arrangement, such as ambient temperature.

Example Ex6d: The aerosol-generating device according to example Ex6c, wherein the second value, in particular the extremal value, occurs or is reached at a temperature of the susceptor arrangement corresponding to a Curie temperature of a material of the susceptor arrangement.

Example Ex7: The aerosol-generating device according to any one of the preceding examples, wherein the controller is configured to identify the type of the article currently received by the receptacle as being unsuitable or incompatible for use with the device.

Example Ex7a: The aerosol-generating device according to example Ex7, wherein the controller is configured to stop or disable operation of the heating arrangement in case the type of the article currently received by the receptacle is identified as being unsuitable or incompatible for use with the device.

Example Ex8: The aerosol-generating device according to any one of the preceding examples, wherein the first value and the second value of the electrical property are values indicative of the electrical conductance of the susceptor arrangement.

Example Ex9: The aerosol-generating device according to any one of the preceding examples, wherein the first value and the second value of the electrical property are values indicative of the supply current drawn by the inductive heating arrangement in heating the susceptor arrangement.

Example Ex10: The aerosol-generating device according to any one of the preceding examples, wherein the device comprises a power supply configured to provide a supply current and operatively connected to the inductive heating arrangement and the controller.

Example Ex11: The aerosol-generating device according to example Ex10, wherein the controller is configured to determine the supply current drawn from the power supply, and to determine the difference between the first value of the electrical property and the second value of the electrical property of the susceptor arrangement from the change in the supply current drawn from the power supply over time.

Example Ex12: The aerosol-generating device according to example Ex10 or Ex11, wherein the controller is configured to determine the supply current and the supply voltage drawn from the power supply, and to determine the difference between the first value of the electrical property and the second value of the electrical property of the susceptor arrangement from the change in the supply current and the supply voltage drawn from the power supply over time.

Example Ex13: The aerosol-generating device according to any one of examples Ex 10 to Ex12, wherein the controller is configured to determine the supply current and the supply voltage drawn from the power supply, and to determine the difference between the first value of the electrical property and the second value of the electrical property of the susceptor arrangement from the change in the ratio of the supply current to the supply voltage drawn from the power supply over time.

Example Ex14: The aerosol-generating device according to any one of examples Ex10 to Ex13, wherein the power supply is a DC power supply.

Example Ex15: The aerosol-generating device according to any one of the preceding examples, wherein the controller is configured to normalize the determined difference between the first value and the second value of the electrical property using a power rating of the inductive heating arrangement used to generate the alternating magnetic field.

Example Ex16: The aerosol-generating device according to any one of the preceding examples, wherein the controller is configured to normalize the determined difference between the first value and the second value according to the following equation:

$$\text{Delta\_Norm}=k*(\text{PowerNorm}-\text{Power})+\text{Delta},$$

wherein Delta_Norm is the normalized difference, Delta is the determined difference, Power_Norm is a power rating coefficient, k is a normalization coefficient empirically determined for a plurality of aerosol-generating devices, and Power is the power rating of the inductive heating arrangement.

Example Ex17: The aerosol-generating device according to example Ex16, wherein the power rating coefficient, Power_Norm, is determined from an average power rating of aerosol-generating devices.

Example Ex18: The aerosol-generating device according to any one of the preceding examples, wherein for identifying the article type the controller is configured to compare the determined difference between the first value and the second value of the electrical property of the susceptor arrangement to one or more stored reference values or reference ranges of the difference.

Example Ex19: The aerosol-generating device according to any one of the preceding examples, wherein the controller is configured to control a heating operation of the inductive heating arrangement in response to the identified article type.

Example Ex20: The aerosol-generating device according to any one of the preceding examples, wherein the controller is configured to a control heating operation of the inductive heating arrangement according to a respective one of one or more predetermined heating profiles, each of which is associated to a specific article type.

Example Ex21: The aerosol-generating device according to any one of the preceding examples, wherein the controller is configured to identify an abnormal deviation of at least one of the first value or the second value of the electrical property.

Example Ex21a: The aerosol-generating device according to any one of the preceding examples, wherein the controller is configured to verify identification of the article type, in particular to verify the first value and the second value determined in a first measurement, or else to identify an abnormal deviation of at least one of the first value or the second value of the electrical property, by repeating the process of determining the first value and the second value in a second measurement and comparing at least one of the first value determined in the first measurement with the first value determined in the second measurement, and the second value determined in the first measurement with the second value determined in the second measurement.

Example Ex21b: The aerosol-generating device according to example Ex21a, wherein for both, the first measurement and the second measurement, the heating arrangement is configured to heat up the susceptor arrangement until the electrical property of the susceptor arrangement reaches or passes an extremal value, in particular a local extremal value, at which the second values is determined Example Ex21c: The aerosol-generating device according to example Ex21a or example Ex21b, wherein the heating arrangement is configured to stop heating between the first measurement and the second measurement or to reduce the heating power between the first measurement and the second measurement or to reduce a duty cycle of the heating process between the first measurement and the second measurement in order to allow the susceptor arrangement to cool down between the first measurement and the second measurement until the electrical property is again below or above the second value, in particular the extremal value, depending on whether the second value, in particular the extremal value is a maximum value or a minimum value.

Example Ex21d: The aerosol-generating device according to any one of examples Ex21a to Ex21c, wherein the controller is configured to identify an abnormal deviation by comparing the second value determined in the first measurement with the second value determined in the second measurement, and by determining that the second value determined in the first measurement deviates from the second value determined in the second measurement by a certain amount, for example, by more than 5 percent or more than 10 percent or more than 20 percent.

Example Ex21e: The aerosol-generating device according to any one of examples Ex21a to Ex21d, wherein the controller is configured to verify identification of the article type by comparing the second value determined in the first measurement with the second value determined in the second measurement, and by determining that the second value determined in the first measurement deviates from the second value determined in the second measurement by at least 5 percent or at least 10 percent.

Example Ex21f: The aerosol-generating device according to any one of examples Ex21a to Ex21e, wherein the controller is configured to determine for the first measurement and the second measurement a time required by the electrical property of the susceptor arrangement to reach the respective extremal value at which the respective second value is determined, in particular a time interval between the determination of the first value and the determination of the second value.

Example Ex21g: The aerosol-generating device according to example Ex1f, wherein the controller is configured to identify an abnormal deviation by comparing the time required by the electrical property of the susceptor arrangement to reach the respective extremal value for the first measurement with the time required by the electrical property of the susceptor arrangement to reach the respective extremal value during the second measurement, and by determining that the time required during the first measurement is shorter than, in particular less than 90 percent or less than 75 percent of the time required during the second measurement.

Example Ex21h: The aerosol-generating device according to example Ex21f or example Ex21g, wherein the controller is configured to verify identification of the article type by comparing the time required by the electrical property of the susceptor arrangement to reach the respective extremal value for the first measurement with the time required by the electrical property of the susceptor arrangement to reach the respective extremal value during the second measurement, and by determining that the time required during the first measurement deviates from the time required during the second measurement by at least 5 percent or at least 10 percent.

Example Ex21i: The aerosol-generating device according to example Ex21a or example Ex21h, wherein the controller is configured to verify identification of the article type if one or at least one of the two criteria "second value determined in the first measurement deviates from the second value determined in the second measurement by at least 5 percent or at least 10 percent" and "time required during the first measurement deviates from the time required during the second measurement by at least 5 percent or at least 10 percent" is met.

Example Ex21j: The aerosol-generating device according to example Ex21a or example Ex21h, wherein the controller is configured to verify identification of the article type if only both of the two criteria "second value determined in the first measurement deviates from the second value determined in the second measurement by at least 5 percent or at least 10 percent" and "time required during the first measurement deviates from the time required during the second measurement by at least 5 percent or at least 10 percent" are met.

Example Ex22: The aerosol-generating device according to any one of examples Ex21 to Ex21j, wherein the controller is configured to control heating operation of the inductive heating arrangement according to a safety heating profile in response to the identification of an abnormal deviation of at least one of the first value or the second value of the electrical property.

Example Ex23: The aerosol-generating device according to any one of the preceding examples, wherein the controller is configured to disable starting an operation of the inductive heating arrangement for a predetermined pause time after a previous operation of the inductive heating arrangement.

Example Ex24: The aerosol-generating device according to example Ex23, wherein the predetermined pause time is in a range between 0.5 seconds to 120 seconds, in particular between 1 second and 60 seconds, preferably between 5 seconds and 30 seconds.

Example Ex25: The aerosol-generating device according to any one of the preceding examples, wherein the device comprises a user interface configured to indicate the identified article type.

Example Ex26: An aerosol-generating system comprising an aerosol-generating device according to any one of examples Ex1 to Ex25, and at least one type of aerosol-generating article or at least two aerosol-generating articles of different types which the device is configured to be used with, in particular to be exclusively used with, wherein the article of each type comprises an aerosol-forming substrate capable to form an inhalable aerosol when heated and an inductively heatable susceptor arrangement for heating the substrate, wherein a material composition of the susceptor arrangement of each article type is such that with increasing temperature an electrical property of the susceptor arrangement changes, in particular decreases or increases, from a first value to a second value, in particular from an initial value to an extremal value, and wherein the susceptor arrangement of each article type has a distinctive difference between the respective first value and the respective second value, the difference being indicative of the article type.

Example Ex27: The aerosol-generating system according to example Ex26, wherein the susceptor arrangements of the different article types differ in at least one of a dimension of the respective susceptor arrangement or the material composition of the respective susceptor arrangement.

Example Ex28: An aerosol-generating system comprising an aerosol-generating device according to any one of examples Ex1 to Ex25, and an aerosol-generating article of a specific type which the device is configured to be used with, in particular to be exclusively used with, wherein the article of the specific type comprises an aerosol-forming substrate capable to form an inhalable aerosol when heated and an inductively heatable susceptor arrangement for heating the substrate, wherein a material composition of the susceptor arrangement is chosen such that with increasing temperature an electrical property of the susceptor arrangement changes, in particular decreases or increases, from a first value to a second value, in particular from an initial value to an extremal value, and wherein the susceptor arrangement has a distinctive difference between the respective first value and the respective second value, the difference being indicative of the specific article type.

Example Ex29: A method of identifying a type of an aerosol-generating article received by an inductively heating aerosol-generating device, in particular an aerosol-generating device according to any one of examples Ex1 to Ex25, wherein the article comprises an aerosol-forming substrate capable to form an inhalable aerosol when heated and a susceptor arrangement inductively heatable by an inductive heating arrangement of the device for heating the substrate, wherein a material composition of the susceptor arrangement is such that with increasing temperature a value of an electrical property of the susceptor arrangement changes, in particular decreases or increases, from a first value to a second extremal value, in particular from an initial value to an extremal value, and wherein the susceptor arrangement of the article type has a distinctive difference between the first value and the second value, the difference being indicative of the article type, the method comprising:

heating-up the aerosol-forming substrate of the aerosol-generating article received by the inductively heating aerosol-generating device using the device, determining during heating the first value and the second value of electrical property of the susceptor arrangement, determining the difference between the first value and the second value of electrical property, and identifying the article type of the aerosol-generating article based on the determined difference.

Example Ex30: The method according to example Ex29, further comprising normalizing the determined difference between the first value and the second value of the electrical property using a power rating of the inductive heating arrangement used to generate the alternating magnetic field.

Example Ex31: The method according to example Ex30, wherein the determined difference between the first value and the second value of the electrical property is normalized according to the following equation:

$$\text{Delta\_Norm}=k*(\text{Power\_Norm}-\text{Power})+\text{Delta},$$

wherein Delta_Norm is the normalized difference, Delta is the determined difference, Power_Norm is a power rating coefficient, k is a normalization coefficient empirically determined for a plurality of aerosol-generating devices, and Power is the power rating of the inductive heating arrangement.

Example Ex32: The method according to example Ex31, wherein the power rating coefficient, Power_Norm, is determined from an average power rating of aerosol-generating devices.

Example Ex33: The method according to any one of examples Ex29 to Ex32, wherein identifying the article type comprises comparing the determined difference between the first value and the second value of the electrical property to one or more stored reference values or reference ranges of the difference, each reference value or reference range being indicative of a specific article type.

Example Ex34: The method according to any one of examples Ex29 to Ex33, further comprising controlling a heating operation of the inductive heating arrangement in response to the identified article type.

Example Ex35: The method according to example Ex34, wherein heating operation of the inductive heating arrangement (in particular after heating-up of the aerosol-forming substrate) is controlled according to a respective one of one or more predetermined heating profiles, each of which is associated to a specific article type.

Example Ex36: The method according to any one of examples Ex29 to Ex35, further comprising identifying an abnormal deviation of at least one of the first value or the second value of the electrical property.

Example Ex37: The method according to example Ex36, wherein the heating operation of the inductive heating arrangement (in particular after heating-up of the aerosol-forming substrate) is controlled according to a safety heating profile in response to identifying an abnormal deviation of at least one of the first value or the second value of the electrical property.

Example Ex38: The method according to any one of examples Ex29 to Ex37, further comprising indicating the identified article type to a user.

Example Ex39: The method according to any one of examples Ex29 to Ex38, further comprising disabling starting an operation of the inductive heating arrangement for a predetermined pause time after a previous operation of the inductive heating arrangement.

Example Ex40: The method according to example 39, wherein the predetermined pause time is in a range between 0.5 seconds to 120 seconds, in particular between 1 second and 60 seconds, preferably between 5 seconds and 30 seconds.

Example Ex41: The method according to any one of examples Ex29 to Ex40, wherein the first value and the second value of the electrical property are values indicative of the electrical conductance of the susceptor arrangement.

Example Ex42: The method according to any one of examples Ex29 to Ex40, wherein the first value and the second value of the electrical property are values indicative of the supply current drawn by the inductive heating arrangement in heating the susceptor arrangement.

Example Ex43: The method according to any one of examples Ex29 to Ex42, wherein the device comprises a power supply configured to provide a supply current and operatively connected to the inductive heating arrangement and the controller.

Example Ex44: The method according to any one of examples Ex29 to Ex43, comprising determining a supply current drawn from a power supply of the aerosol-generating device, wherein the difference between the first value of the electrical property and the second value of the electrical property of the susceptor arrangement is determined from the change in the supply current drawn from the power supply over time.

Example Ex45: The method according to any one of examples Ex29 to Ex44, comprising determining a supply current and a supply voltage drawn from a power supply of the aerosol-generating device, wherein the difference between the first value of the electrical property and the second value of the electrical property of the susceptor arrangement is determined from the change in the supply current and the supply voltage drawn from the power supply over time.

Example Ex46: The method according to example Ex45, wherein the difference between the first value of the electrical property and the second value of the electrical property of the susceptor arrangement is determined from the change in the ratio of the supply current to the supply voltage drawn from the power supply over time.

Example Ex47: The method according to any one of examples Ex29 to Ex46, comprising identifying the type of the article currently received by the aerosol-generating device as being unsuitable or incompatible for use with the device, in particular when the determined difference does not correspond to any reference value or reference range of the difference.

Example Ex48: The method according to example Ex47, comprising stopping or disabling an operation of the heating arrangement in case the type of the article currently received by the device is identified as being unsuitable or incompatible for use with the device.

Example Ex49: The method according to any one of examples Ex29 to Ex48, wherein the first value is an initial value of the electrical property and the second value is an extremal value, in particular minimum value or a maximum value, of the electrical property.

Example Ex50: The method according to any one of examples Ex29 to Ex49, wherein the first value, in particular the initial value, occurs or is reached during heating-up the susceptor arrangement, in particular from an initial temperature, such as ambient temperature, to an operating temperature.

Example Ex51: The method according to example Ex50, wherein the second value, in particular the extremal value occurs or is reached during heating-up the susceptor arrangement, in particular from an initial temperature, such as ambient temperature, to an operating temperature.

Example Ex52: The v according to any one of examples Ex29 to Ex51, wherein the first value, in particular the initial value occurs or is reached at a start of the heat-up of the susceptor arrangement, in particular at an initial temperature of the susceptor arrangement, such as ambient temperature.

Example Ex53: The method according to example Ex52, wherein the second value, in particular the extremal value, occurs or is reached at a temperature of the susceptor arrangement corresponding to a Curie temperature of a material of the susceptor arrangement.

Examples will now be further described with reference to the figures in which:

FIGS. 1-2 schematically illustrate an aerosol-generating system according to an exemplary embodiment of the present invention, including an aerosol-generating device and an aerosol-generating article for use with the device;

Figure 1:
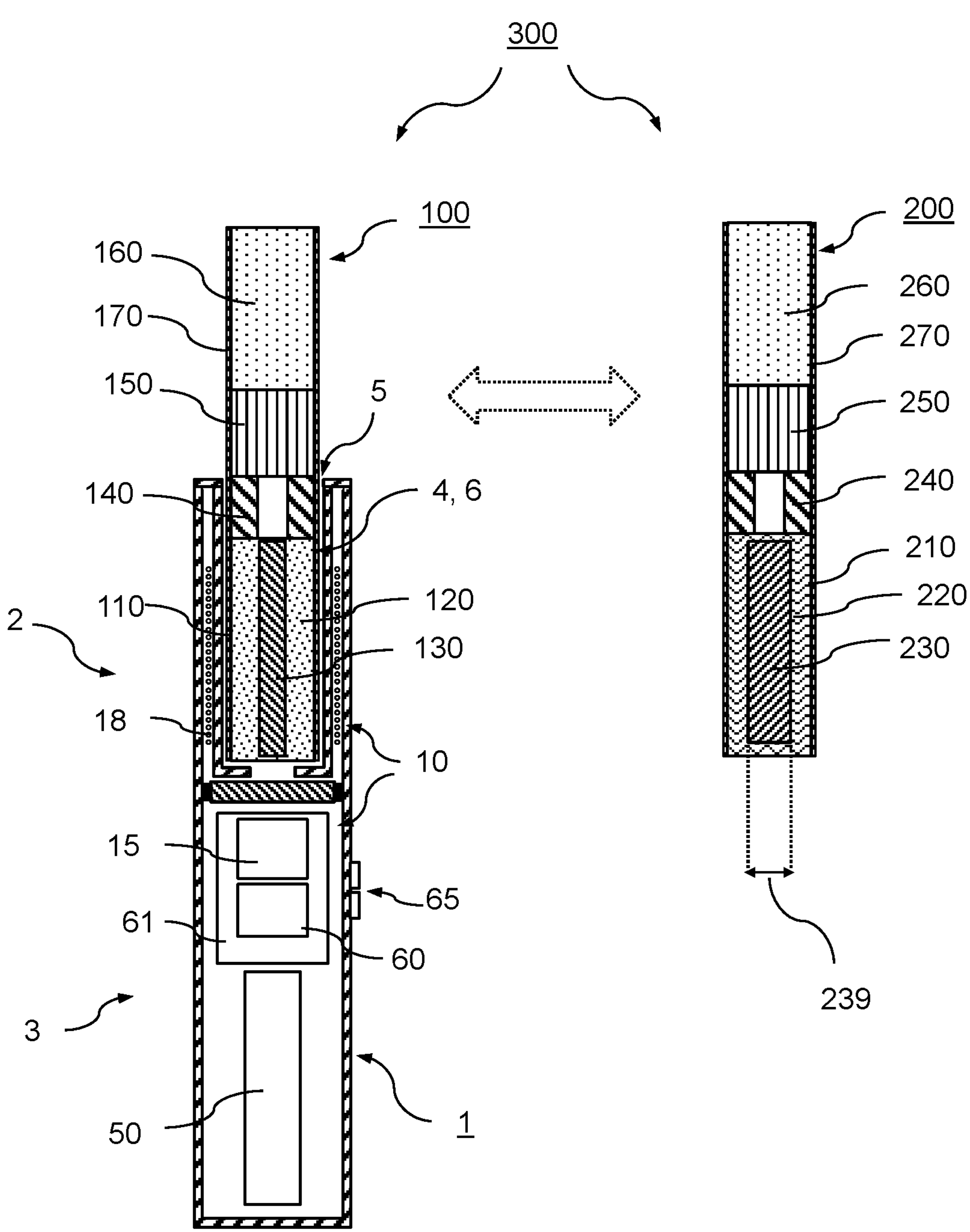
Figure 2:
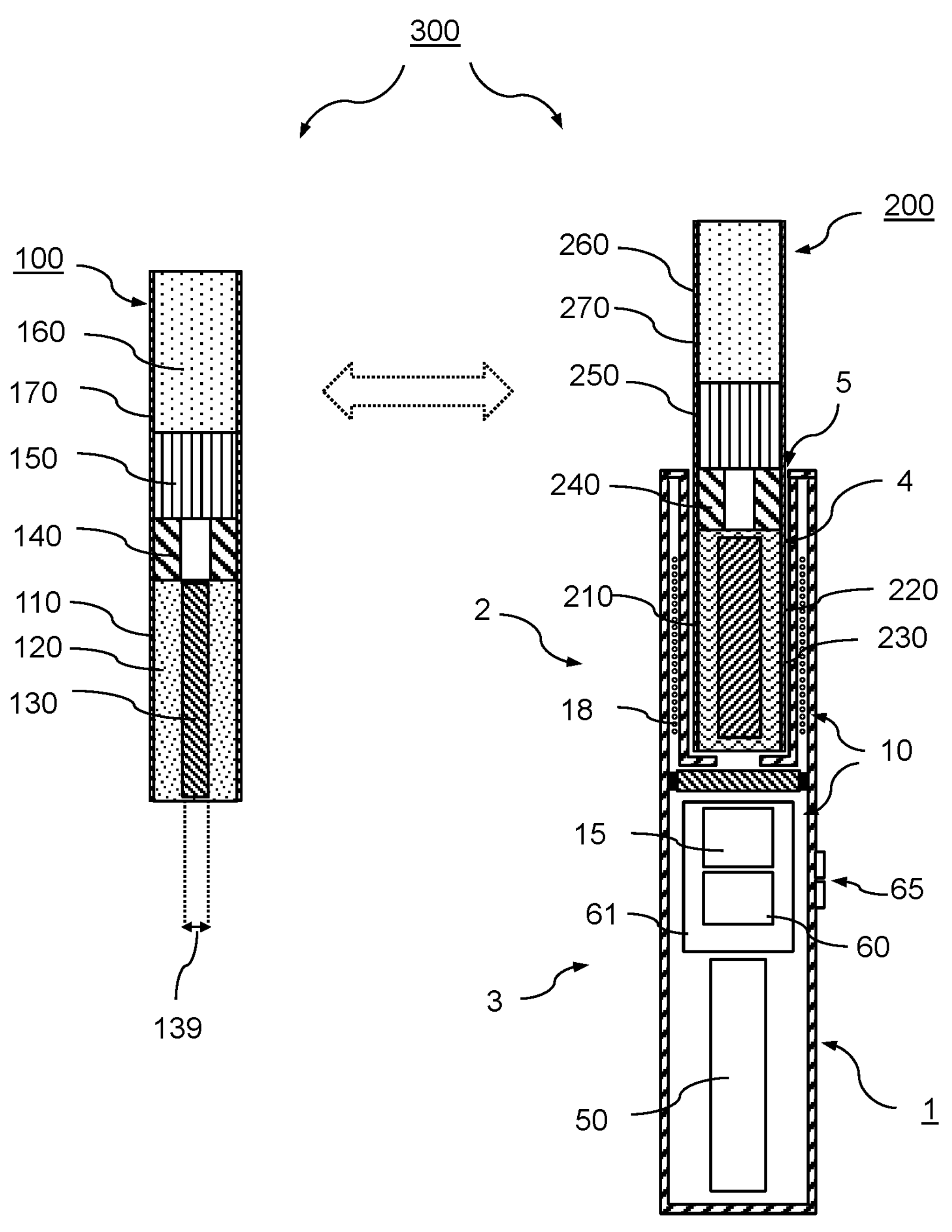
Figure 6:
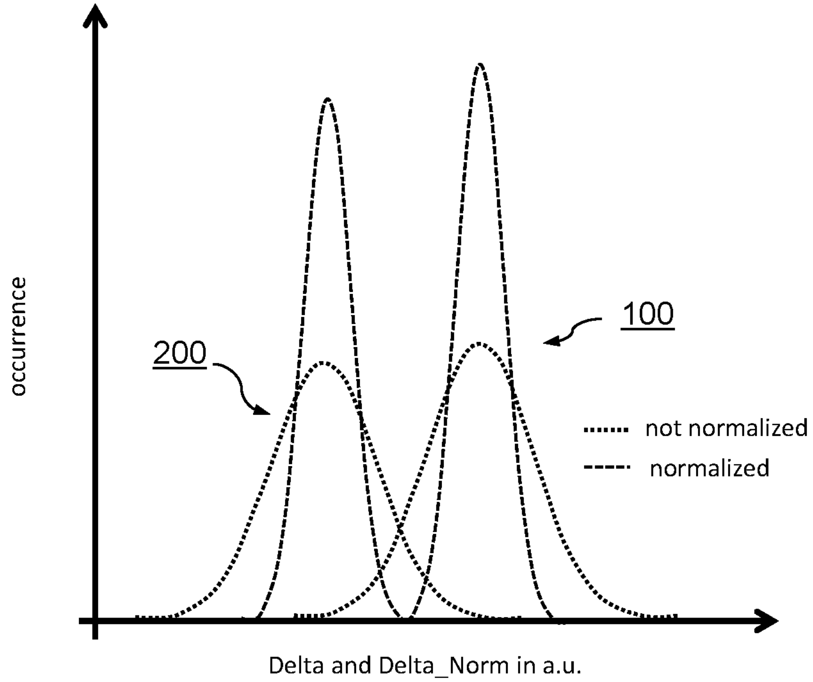
Figures 7, 8:
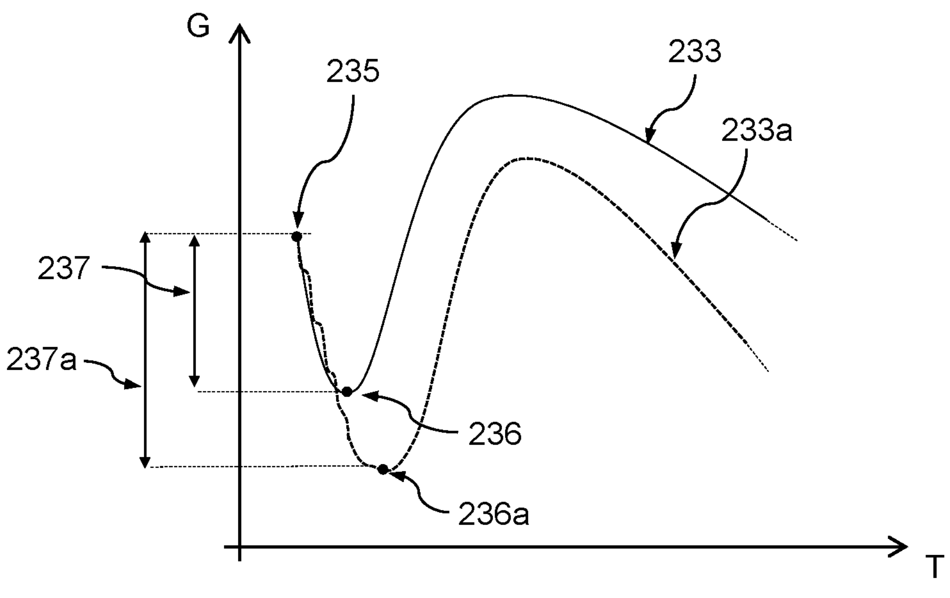

FIG. 6 schematically illustrates the respective distributions of the difference Delta with and without normalization for each of the articles of the aerosol-generating system shown in FIG. 1 and FIG. 2; and FIGS. 7-8 show the conductance-versus-temperature profile for one of the articles of the aerosol-generating system shown in FIG. 1 and FIG. 2 for different situations which may cause a misidentification of the article type.

FIG. 1 and FIG. 2 schematically illustrate an exemplary embodiment of an aerosol-generating system 300 according to the present invention that is capable to generate an inhalable aerosol by heating an aerosol-forming substrate. The system 300 comprises at least two aerosol-generating articles 100, 200 of different types as well as an aerosol-generating device 1 for alternative use with the at least two different types of articles 100, 200. While FIG. 1 shows the aerosol-generating device 1 in use with the aerosol-generating article 100 of the first type, FIG. 2 shows the aerosol-generating device 1 in use with the aerosol-generating article 200 of the second type.

Each of the two aerosol-generating articles 100, 200 has a substantially rod-shape resembling the shape of a conventional cigarette. In the present embodiment, each of the two articles 100, 200 comprises four elements sequentially arranged in coaxial alignment: a substrate element 110, 210 arranged at a distal end of the respective article 100, 200, a support element 140, 240 with a central air passage, an aerosol-cooling element 150, 250, and a filter element 160, 260 arranged at a proximal end of the respective article 100, 200 which serves as a mouthpiece. Each substrate element 110, 210 comprises an aerosol-forming substrate 120, 220 capable to form an inhalable aerosol when heated as well as an inductively heatable susceptor arrangement 130, 230 which is in direct physical contact with the respective substrate 120, 220 for heating the same. In the present embodiment, the aerosol-generating article 100 of the first type comprises a solid aerosol-forming substrate 120, whereas the aerosol-generating article 200 of the second type comprises a gel-like aerosol-forming substrate 220.

Figures 3, 4:
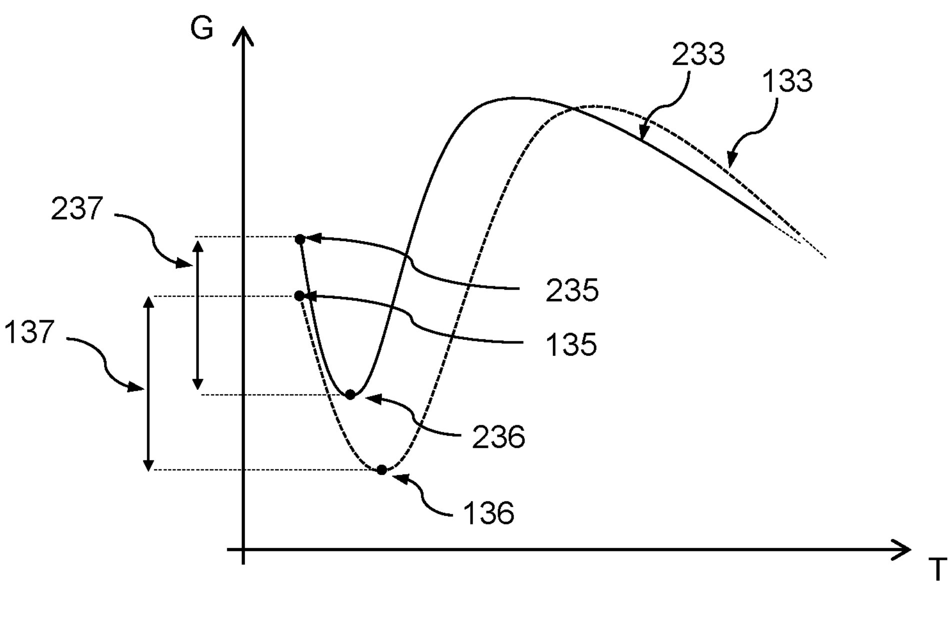
FIG. 3 shows a conductance-versus-temperature profile for each of the articles of the aerosol-generating system shown in FIG. 1 and FIG. 2.
FIG. 4 shows details of the inductive heating arrangement for articles of the aerosol-generating system shown in FIG. 1 and FIG. 2.

Referring to FIGS. 1-3, a material composition of each susceptor arrangement 130, 230 of each article type is such that with increasing temperature a value of an electrical property of the susceptor arrangement 130, 230 changes from a first value 135, 235 to a second value 136, 236, in particular from an initial value 135, 235 to an extremal value 136, 236. In the present embodiment, the material composition of each susceptor arrangement 130, 230 is such that with increasing temperature a value of the electrical conductance G of the respective susceptor arrangement 130, 230 decreases from a respective initial value 135, 235 to an extremal value 136, 236, that is, a minimum value, and subsequently increases again as the temperature further rises. This behavior is shown in FIG. 3. As can be further seen in FIG. 3, the susceptor arrangements 130, 230 of the first-type article 100 and the second-type article 200 have different conductance-versus-temperature profiles 133, 233. In particular, each of the susceptor arrangements 130, 230 has a distinctive difference Delta 137, 237 between the respective initial value 135, 235 and the respective extremal value 136, 236 of the electrical conductance G. In general, the different conductance-versus-temperature profiles 133, 233, in particular the different values of distinctive difference Delta 137, 237 may due to the susceptor arrangements 130, 230 differing in at least one of a dimension of the susceptor arrangements 130, 230 or the material composition of the susceptor arrangements 130, 230. In the present embodiment, the susceptor arrangements 130, 230 both are strip-shaped susceptor arrangements made of the same material, but having different dimensions, in particular different width dimensions 139, 239 with respect to the strip shape, as shown in FIG. 1 and FIG. 2.

Apart from the different aerosol-forming substrates 120, 220 and the different susceptor arrangements 130, 230, the articles 100, 200 of both types are substantially identical, in particular with regard to the support elements 140, 240, the aerosol-cooling elements 150, 250, and the filter elements 160, 260. In the articles 100, 200 of both types, the respective four elements have a substantially cylindrical shape with substantially the same diameter. In addition, the four elements are circumscribed by an outer wrapper 170, 270 such as to keep the elements together and to maintain the desired circular cross-sectional shape of the article 100, 200. The wrapper 170, 270 preferably is made of paper. Further details of the article 100, 200, in particular of the four elements, are disclosed, for example, in WO 2015/176898 A1.

The elongate aerosol-generating device 1 comprises two portions: a proximal portion 2 and a distal portion 3. In the proximal portion 2, the device 1 comprises a cavity 4 which forms a receptacle 6 for removably receiving at least a portion of the respective aerosol-generating article 100, 200. In the distal portion 3, the device 1 comprises a DC power supply 50, such as a rechargeable battery, for powering operation of the device 1, as well as a controller 60 for controlling operation of the device 1. For heating the substrates 120, 220 in the respective articles 100, 200, the device 1 comprises an inductive heating arrangement 10 operatively coupled to the controller 60. The heating arrangement 10 includes an electrical circuitry 15 and an induction coil 18 for generating an alternating, in particular high-frequency magnetic field within the cavity 4.

FIG. 4 shows details of the inductive heating arrangement 10. According to the present embodiment, the inductive heating arrangement 10 comprises a DC/AC inverter which is connected to the DC power source 50 shown in FIG. 1 and FIG. 2. The DC/AC inverter includes a Class-E power amplifier which in turn includes the following components: a transistor switch 11 comprising a Field Effect Transistor T (FET), for example a Metal-Oxide-Semiconductor Field Effect Transistor (MOSFET), a transistor switch supply circuit indicated by the arrow 12 for supplying a switching signal (gate-source voltage) to the transistor switch 11 and an LC load network 13 comprising a shunt capacitor C1 and a series connection of a capacitor C2 and inductor L2. The inductor L2 corresponds to the induction coil 18 shown in FIG. 1 and FIG. 2 used to generate the alternating magnetic field within the cavity 4. In addition, there is provided a choke L1 for supplying a DC supply voltage +V_DC from to the DC power source 50. Also shown in FIG. 3 is the ohmic resistance R representing the total equivalent resistance or total resistive load 14, which—in use of the system—is the sum of the ohmic resistance of the induction coil 18, marked as L2, and the ohmic resistance of the respective susceptor arrangement 130, 230 which in turn is substantially inversely proportional to the electrical conductance G of the respective susceptor arrangement 130, 230. Further details of the inductive heating arrangement 10 according to the present embodiment, in particular with regard to its working principle, are disclosed, for example, in WO 2015/177046 A1. The electrical circuitry 15 of the electrical heating arrangement 10 (apart from the induction coil 18) is arranged on the printed circuit board 61 together with the main control unit 60.

As can be seen in FIG. 1 and FIG. 2, the induction coil 18 is a helical coil which is arranged in the proximal portion 2 of the device 1 such as to circumferentially surround the cylindrical receiving cavity 4. Accordingly, upon inserting a respective article 100, 200 into the cavity 4 of the device 100 (as shown in FIG. 1 and FIG. 2) and activating the heating arrangement 10, the respective susceptor arrangement 130, 230 experiences a varying magnetic field which in turn induces at least one of Eddy currents and hysteresis losses in the susceptor arrangement 130, 230, depending on the magnetic and electric properties of the respective material composition of the susceptor arrangement 130, 230. As a consequence, the susceptor arrangement 130, 230 heats up until reaching an operation temperature sufficient to vaporize the respective aerosol-forming substrate 120, 220 surrounding the susceptor arrangement 130, 230 within the article 100, 200. During this heat-up, the conductance of the susceptor arrangement 130, 230 shows a course 133, 233 as explained above and illustrated in FIG. 3. Upon having reached the operation temperature, the system 300 is ready for use, and a user may take a puff at the at the filter element 160, 260 of the respective article 100, 200 being received in the device 1. In doing so, air is drawn into the cavity 4 at the rim of the insertion opening 5. From there, the air flow further extends towards the distal end of the cavity 4 through a passage which is formed between the inner surface of the cylindrical cavity 4 and the outer surface of the respective article 100, 200. At the distal end of the cavity 4, the air flow enters the aerosol-generating article 100, 200 through the respective substrate element 110, 210, and further passes through the support element 140, 240, the aerosol cooling element 150, 250 and the filter element 160, 260, where it finally exits the article 100, 200. During heating, vaporized material from the aerosol-forming substrate 120, 220 is entrained into the air flow through the substrate element 110, 210. When further passing through the support element 140, 240, the cooling element 150, 250 and the filter element 160, 260, the air flow including the vaporized material cools down such as to form an aerosol escaping the article 100, 200 through the filter element 160, 260.

Different types of aerosol-generating articles comprising different aerosol-forming substrates may require different heating operation. For example, the aerosol-generating article 100 of the first type according to the present embodiment which comprises a solid tobacco containing aerosol-forming substrate may require a lower operating temperature than the aerosol-generating article 200 of the second type according to the present embodiment which comprises a gel-like aerosol-forming substrate. For this as well as for preventing operation of the device 1 with any unsuitable or incompatible articles, proper article identification is essential. According to the present invention, it has been found that the difference between an initial value and an extremal value of an electrical property of the susceptor arrangement in the article may be used as a distinctive indicator for the article type. With respect to the present embodiment, it is the difference Delta 137, 237 between the respective initial value 135, 235 and the respective minimum value 136, 236 of the electrical conductance G of the susceptor arrangement 130, 230, which is distinctive for each one of the articles 100, 200 as illustrated in FIG. 3, and may thus be used to identify the type of an article received in the cavity 4. For this, the controller 60 of the device 1 is configured to determine the supply current drawn by the heating arrangement 10 from the power supply 50, and further to determine the difference between the respective initial value 135, 235 and the respective minimum value 136, 236 of the electrical conductance G of the susceptor arrangement 130, 230 from a corresponding initial value and a corresponding extremal value of the current drawn from the power supply 50, or likewise, from of the change in the supply current drawn from the power supply 50 over time. For determining the current drawn from the power supply 50, the aerosol-generating device 1 according to the present embodiment comprises a current measurement device 62 operatively coupled to the controller 60 as shown FIG. 4. Measuring the current may be sufficient in case the voltage provided by the power supply 50 is constant, because in this case the conductance G over time is a substantially linear function of the current over time only. In this case, the respective values reflecting the conductance G may result from the ratio of the determined current values to the nominal supply voltage of the power supply 50, wherein the value of the nominal supply voltage may be stored in the controller 60. Otherwise, when the supply voltage is not constant, the voltage has to be measured as well for determining the conductance as a function both, the supply current and the supply voltage over time. For this, the aerosol-generating device 1 may further comprise a voltage measurement device 63 as also shown FIG. 4. Like the current measurement device 62, the voltage measurement device 63 is operatively coupled to the controller 60, thus allowing the controller 60 to determine both the supply current and the supply voltage drawn from the power supply 50, and to determine the difference between the respective initial value 135, 235 and the respective minimum 136, 236 of the electrical conductance G of the susceptor arrangements 130, 230 from the change in the supply current and the supply voltage drawn from the power supply 50 over time. In particular, the controller 60 may be configured to determine the difference between the respective initial value 135, 235 and the respective minimum 136, 236 of the electrical conductance G of the susceptor arrangement 130, 230 from the change in the ratio of the supply current to the supply voltage drawn from the power supply 50 over time.

In use, when an aerosol-generating article has been inserted into the cavity 4 of the device 1, the heating arrangement 10 starts to heat up the susceptor arrangement in article. At the start of the heating operation, the controller 60 in combination with the measuring devices 62, 63 determines the initial supply current and—if required—the corresponding supply voltage drawn from the power supply 50. As the temperature increases during the heating operation, the supply current decreases and reaches a minimum value before increasing again. This minimum value of the supply current and—if required—the corresponding supply voltage drawn from the power supply 50 are also determined by the controller 60. Having done so, the controller 60 determines the initial value and the minimum value of the electrical conductance G from the ratio of the determined initial supply current to the corresponding supply voltage and from the determined minimum supply current to the corresponding supply voltage, respectively. As described above, when the supply voltage is constant over time, it may be sufficient to determine the supply current only and to determine the initial value and the respective minimum of the electrical conductance G from the ratio of the respectively determined current to the nominal supply voltage of the power supply 50. Likewise, it is also possible to use the supply current only (instead of the conductance) as an electrical property of the susceptor arrangement which shows a distinctive change over temperature that is indicative of the article type.

Once having determined the initial value and the minimum value of the electrical conductance, the controller 60 determines the difference between these values. Subsequently, the determined difference is compared to reference values or reference ranges which are stored in the controller 60 for each article type the device is configured for used with. Accordingly, if the determined difference corresponds to the reference value or reference range of the difference for the first-type article 100, the controller 60 identifies the article currently received in the cavity 4 as an aerosol-generating article 100 of the first type. Likewise, if the determined difference corresponds to the reference value or reference range of the difference for the second-type article 200, the controller 60 identifies the article currently received in the cavity 4 as an aerosol-generating article 200 of the second type. Otherwise, the controller 60 identifies the article currently received in the cavity 4 as an article being unsuitable or incompatible for use with the device 1. In the latter case, the controller 60 may stop the heating operation of the heating arrangement 10. In the other cases, the controller 60 controls heating operation of the inductive heating arrangement 10 according to a respective, predetermined heating profile associated to the first-type article 100 or the second-type article 200, respectively.

As described further above, the actual power rating, that is, the maximum power that can be provided by the heating arrangement 10, may vary for different aerosol-generating devices due to manufacturing tolerances. This variance in the maximum power available may have an effect, in particular when the article identification is performed during the heat-up, where the inductive heating arrangement 10 typically is operated at maximum power. In order to reduce the effect of the variance in the maximum power, the controller 60 according to the present embodiment is configured to normalize the determined difference Delta between the initial value 135, 235 and the extremal value 136, 236 of the conductance G using a power rating of the inductive heating arrangement 10. For example, the controller 60 may be configured to normalize the determined difference Delta between these values 135, 235, 136, 236 according to the equation: Delta_Norm =k*(PowerNorm−Power)+Delta, wherein Delta_Norm is the normalized difference between the initial value and the extremal value of the electrical conductance, Delta is the determined difference, and Power is the power rating of the inductive heating arrangement 10 at hand. The power rating of the inductive heating arrangement 10 may be determined and coded into the controller 60 during manufacturing of the device 1 using a calibration article including a calibration susceptor arrangement. Power_Norm is average power rating and k is a normalization coefficient, each of which is empirically determined for a plurality of aerosol-generating devices in advance and coded into the controller 60 during manufacturing of the device 1.

Figure 5:
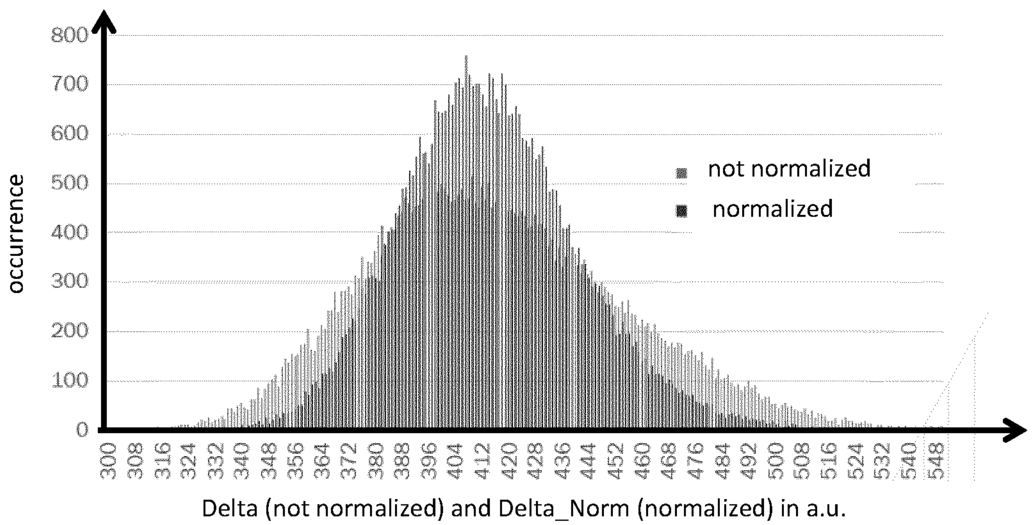
FIG. 5 shows a distribution of the difference Delta determined for a plurality of articles of the same type with and without normalization.

Advantageously, this kind of normalization causes the distribution of differences between the initial value and the extremal value determined for a plurality of articles of the same type to have a reduced standard deviation as without power normalization. This is illustrated in FIG. 5 which shows the distribution of the difference Delta, Delta-Norm determined for a plurality of articles of the same type with and without normalization. As a consequence, the respective distributions of differences determined for articles of different types can be better distinguished from each other. This is shown in FIG. 6 which schematically illustrates the respective distributions of the difference Delta, Delta_Norm for the first-type article 100 and the second-type article 200 with and without normalization. Due to the normalization, the distributions of the difference Delta_Norm for the first-type article 100 and the second-type article 200 do not overlap any more. Thus, it is less likely that an article of one type is erroneously identified as an article of another type.

If a user displaces the aerosol-generating article relative to aerosol-generating device during the critical time window between the measurement of the initial value and the extremal value by pushing the article further into the receptacle (for example, because the article was not fully received by the receptacle), the determined difference 237*a* between the initial value 235 and the extremal value 236*a* of the conductance may be falsified as each push may provoke a sudden drop of the conductance G. This is shown in FIG. 7 which illustrates the conductance-versus-temperature profile 233, 233*a* for the second-first type article 200 with (dashed line 233*a*) and without (continuous line 233) a user having repeatedly pushed the article 200 further into the cavity 4. As a consequence, in the example given in FIG. 7, the actually determined difference 237*a* between the initial value 235 and the extremal value 236*a* is larger than the difference 237 determined without any article displacement having taken place. The controller 60 is configured to identify such abnormal deviation of at least one of the initial value 235 or the extremal value 236, 236*a* of the conductance, and—in response to this—to control the heating operation of the inductive heating arrangement 10 according to a safety heating profile, for example according to the heating profile associated to the article 100 of the first type which involves a lower operating temperature. Thus, overheating may be effectively prevented. A misidentification may also occur, if the susceptor arrangement 230 is at an increased temperature level T1 at the start of a user experience as shown in FIG. 8 for an aerosol-generating article 200 of the second type. This situation may occur, for example, when a user aborts a user experience by stopping operation of the heating arrangement and only shortly after that restarts a new user experience with the same article. Likewise, such a situation may occur, when the article has already been heated by another device or an oven before being inserting into the device. Accordingly, when the susceptor arrangement 230 is at an increased temperature level T1, the initial value 235*b* of the conductance determined after a "hot" (re)start may be lower than the initial value 235 being determined at a lower temperature level T0. This is also shown in FIG. 8. As a consequence, the determined difference 237*b* of the conductance would be too low. To avoid a misidentification under such circumstances, the controller 60 is configured to disable starting an new operation of the inductive heating arrangement 10 for a predetermined pause time after a previous operation of the inductive heating arrangement, for example, for 60 seconds. This pause is long enough to allow for a sufficient cool down of the susceptor arrangement 130, 230.

As further shown in FIG. 1 and FIG. 2, the device 1 comprises a user interface 65 configured to indicate the identified article type. In the present embodiment, the user interface 65 comprises two LEDs (Light Emitting Diodes), one to indicate that an aerosol-generating article 100 of the first type is received in the cavity 4, the other one to indicate that an aerosol-generating article 200 of the second type is received in the cavity 4.

For the purpose of the present description and of the appended claims, except where otherwise indicated, all numbers expressing amounts, quantities, percentages, and so forth, are to be understood as being modified in all instances by the term "about". Also, all ranges include the maximum and minimum points disclosed and include any intermediate ranges therein, which may or may not be specifically enumerated herein. In this context, therefore, a number A is understood as A ±5 percent of A. Within this context, a number A may be considered to include numerical values that are within general standard error for the measurement of the property that the number A modifies. The number A, in some instances as used in the appended claims, may deviate by the percentages enumerated above provided that the amount by which A deviates does not materially affect the basic and novel characteristic(s) of the claimed invention. Also, all ranges include the maximum and minimum points disclosed and include any intermediate ranges therein, which may or may not be specifically enumerated herein.

The invention claimed is:

1. An aerosol-generating device for alternative use with at least a first type and a second type of inductively heatable aerosol-generating articles comprising a susceptor arrangement, the aerosol-generating device comprising:

a receptacle configured to removably receive at least a portion of an aerosol-generating article from among the first type or the second type of aerosol-generating articles;

an inductive heating arrangement configured to generate an alternating magnetic field for inductively heating the susceptor arrangement of the aerosol-generating article when the aerosol-generating article is received by the receptacle; and a controller operatively connected to the inductive heating arrangement and being configured to:

determine a first value and a second value of an electrical property of the susceptor arrangement of the aerosol-generating article, the electrical property being reached during heating of the susceptor arrangement in use of the device when the aerosol-generating article is received by the receptacle, determine the difference between the first value and the second value, and identify an article type of the aerosol-generating article received by the receptacle based on the determined difference.

2. The aerosol-generating device according to claim 1, wherein the first value and the second value of the electrical property are values indicative of an electrical conductance of the susceptor arrangement or values indicative of a supply current drawn by the inductive heating arrangement in heating the susceptor arrangement.

3. The aerosol-generating device according to claim 1, further comprising a power supply configured to provide a supply current and operatively connected to the inductive heating arrangement and the controller.

4. The aerosol-generating device according to claim 3, wherein the controller is further configured to determine the supply current drawn from the power supply, and to determine the difference between the first value of the electrical property and the second value of the electrical property of the susceptor arrangement from a change in the supply current drawn from the power supply over time.

5. The aerosol-generating device according to claim 3, wherein the controller is further configured to determine the supply current and a supply voltage drawn from the power supply, and to determine the difference between the first value of the electrical property and the second value of the electrical property of the susceptor arrangement from the change in the supply current and the supply voltage drawn from the power supply over time.

6. The aerosol-generating device according to claim 1, wherein the controller is further configured to normalize the determined difference between the first value and the second value of the electrical property using a power rating of the inductive heating arrangement used to generate the alternating magnetic field.

7. The aerosol-generating device according to claim 1, wherein the controller is further configured to identify the article type of the aerosol-generating article received by the receptacle based on the determined difference by normalizing the determined difference between the first value and the second value according to the following equation:

Delta_Norm=k*(Power_Norm-Power)+Delta, wherein Delta_Norm is the normalized difference, Delta is the determined difference, Power_Norm is a power rating coefficient, k is a normalization coefficient empirically determined for a plurality of aerosol-generating devices, and Power is the power rating of the inductive heating arrangement.

8. The aerosol-generating device according to claim 1, wherein the controller is further configured to control a heating operation of the inductive heating arrangement in response to the identified article type.

9. The aerosol-generating device according to claim 1, wherein the controller is further configured to a control heating operation of the inductive heating arrangement according to a respective one of one or more predetermined heating profiles, each of which is associated to a specific article type.

10. The aerosol-generating device according to claim 1, wherein the controller is further configured to identify an abnormal deviation of at least one of the first value or the second value of the electrical property.

11. The aerosol-generating device according to claim 10, wherein the controller is further configured to control heating operation of the inductive heating arrangement according to a safety heating profile in response to an identification of an abnormal deviation of at least one of the first value or the second value of the electrical property.

12. The aerosol-generating device according to claim 1, wherein the controller is further configured to disable starting an operation of the inductive heating arrangement for a predetermined pause time after a previous operation of the inductive heating arrangement.

13. An aerosol-generating system comprising:

an aerosol-generating device according to claim 1; and at least one type of aerosol-generating article or at least two aerosol-generating articles of different types which the aerosol-generating device is configured to be used with, wherein the aerosol-generating article of each type comprises an aerosol-forming substrate configured to form an inhalable aerosol when heated and an inductively heatable susceptor arrangement configured to heat the aerosol-forming substrate, wherein a material composition of the susceptor arrangement of each article type is such that with increasing temperature an electrical property of the susceptor arrangement changes from a first value to a second value, and wherein the susceptor arrangement of each article type has a distinctive difference between the respective first value and the respective second value, the difference being indicative of the article type.

14. The aerosol-generating system according to claim 13, wherein the susceptor arrangements of the different article types differ in at least one of a dimension of the respective susceptor arrangement or the material composition of the respective susceptor arrangement.

15. An aerosol-generating system, comprising:

an aerosol-generating device according to claim 1; and an aerosol-generating article of a specific type which the aerosol-generating device is configured to be used with, wherein the aerosol-generating article of the specific type comprises an aerosol-forming substrate configured to form an inhalable aerosol when heated and an inductively heatable susceptor arrangement configured to heat the aerosol-forming substrate, wherein a material composition of the susceptor arrangement is chosen such that with increasing temperature an electrical property of the susceptor arrangement changes from a first value to a second value, and wherein the susceptor arrangement has a distinctive difference between the first value and the second value, the difference being indicative of the specific article type.

* * * * *